United States Patent
Hongo

(10) Patent No.: US 7,582,507 B2
(45) Date of Patent: Sep. 1, 2009

(54) CATALYST SUPPORT SUBSTRATE, METHOD FOR GROWING CARBON NANOTUBES USING THE SAME, AND THE TRANSISTOR USING CARBON NANOTUBES

(75) Inventor: Hiroo Hongo, Tokyo (JP)

(73) Assignee: NEC Corporation, Tokyo (JP)

( * ) Notice: Subject to any disclaimer, the term of this patent is extended or adjusted under 35 U.S.C. 154(b) by 734 days.

(21) Appl. No.: 10/523,418

(22) PCT Filed: Jul. 28, 2003

(86) PCT No.: PCT/JP03/09548

§ 371 (c)(1),
(2), (4) Date: Feb. 1, 2005

(65) Prior Publication Data

US 2006/0240974 A1    Oct. 26, 2006

(30) Foreign Application Priority Data

Aug. 2, 2002    (JP) ............... 2002-226020

(51) Int. Cl.
H01L 51/40    (2006.01)
(52) U.S. Cl. ............ 438/99; 438/82; 438/780; 438/903; 257/E21.007; 257/E21.492; 977/742; 977/750
(58) Field of Classification Search ......... 438/903; 257/E21.005, E21.007, E21.299, E21.492; 977/700, 720, 721, 743, 750
See application file for complete search history.

(56) References Cited

U.S. PATENT DOCUMENTS 6,445,006 B1 * 9/2002 Brandes et al. ............. 257/76

2003/0042226 A1 * 3/2003 Coll et al. .................. 216/41
2005/0042162 A1 * 2/2005 Resasco et al. .......... 423/447.3

FOREIGN PATENT DOCUMENTS

EP    1 061 043 A1    12/2000
EP    1 129 990 A1    9/2001

(Continued)

OTHER PUBLICATIONS

Jing Kong, et al., Nature, vol. 395, p. 878 (1998), "Synthesis of Individual Single-Walled Carbon Nanotubes on Patterned Silicon Wafers".
Jason H. Hafner, et al., Chemical Physics Letter, vol. 296, p. 195 (1998), "Catalytic Growth of Single-Wall Carbon Nanotubes from Metal Particles".

(Continued)

*Primary Examiner*—Alexander G Ghyka
*Assistant Examiner*—Cheung Lee
(74) *Attorney, Agent, or Firm*—Scully, Scott, Murphy & Presser, P.C.

(57)    ABSTRACT

A catalyst supporting substrate includes a first region (54) which is formed on a substrate (50); and a second region (55) which is formed covering a part of the first region. The first region (54) includes a catalyst supporting portion (54a) containing a first material. The second region (55) includes a catalyst portion (55) containing a second material which is different from the first material. The first material includes a metal containing at least one of elements selected from the second group to the fourteenth group of the periodic table or a compound thereof. The second material is a catalyst which grows carbon nanotubes in a vapor phase.

23 Claims, 21 Drawing Sheets

FOREIGN PATENT DOCUMENTS

| | | |
|---|---|---|
| JP | 8-100328 | 4/1996 |
| JP | 11-11917 | 1/1999 |
| JP | 2001-20072 A | 1/2001 |
| JP | 2001-48512 A | 2/2001 |
| JP | 2001-176431 A | 6/2001 |
| JP | 2001-262343 | 9/2001 |
| JP | 2002-105765 A | 4/2002 |
| JP | 2002-115070 A | 4/2002 |
| JP | 2002-115071 A | 4/2002 |
| JP | 2002-146534 A | 5/2002 |
| JP | 2002-180252 A | 6/2002 |

OTHER PUBLICATIONS

H. Hongo, et al., Chemical Physics Letters (2002), "Chemical Vapor Deposition of Single-Wall Carbon Nanotubes on Iron-film-coated SapphireSubstrates".

S.J. Wind, et al., Applied Physics Letters, vol. 80, No. 20, (May 20, 2002), "Vertical Scaling of Carbon Nanotube Field-Effect Transistors Using Top Gate Electrodes".

Seizo Kinoshita, et al., IEICE, vol. 101, No. 618, pp. 47-52 (2002), "Room Temperature Coulomb Brockade Characteristics of Position Controlled Grown Carbon Nanotube".

\* cited by examiner

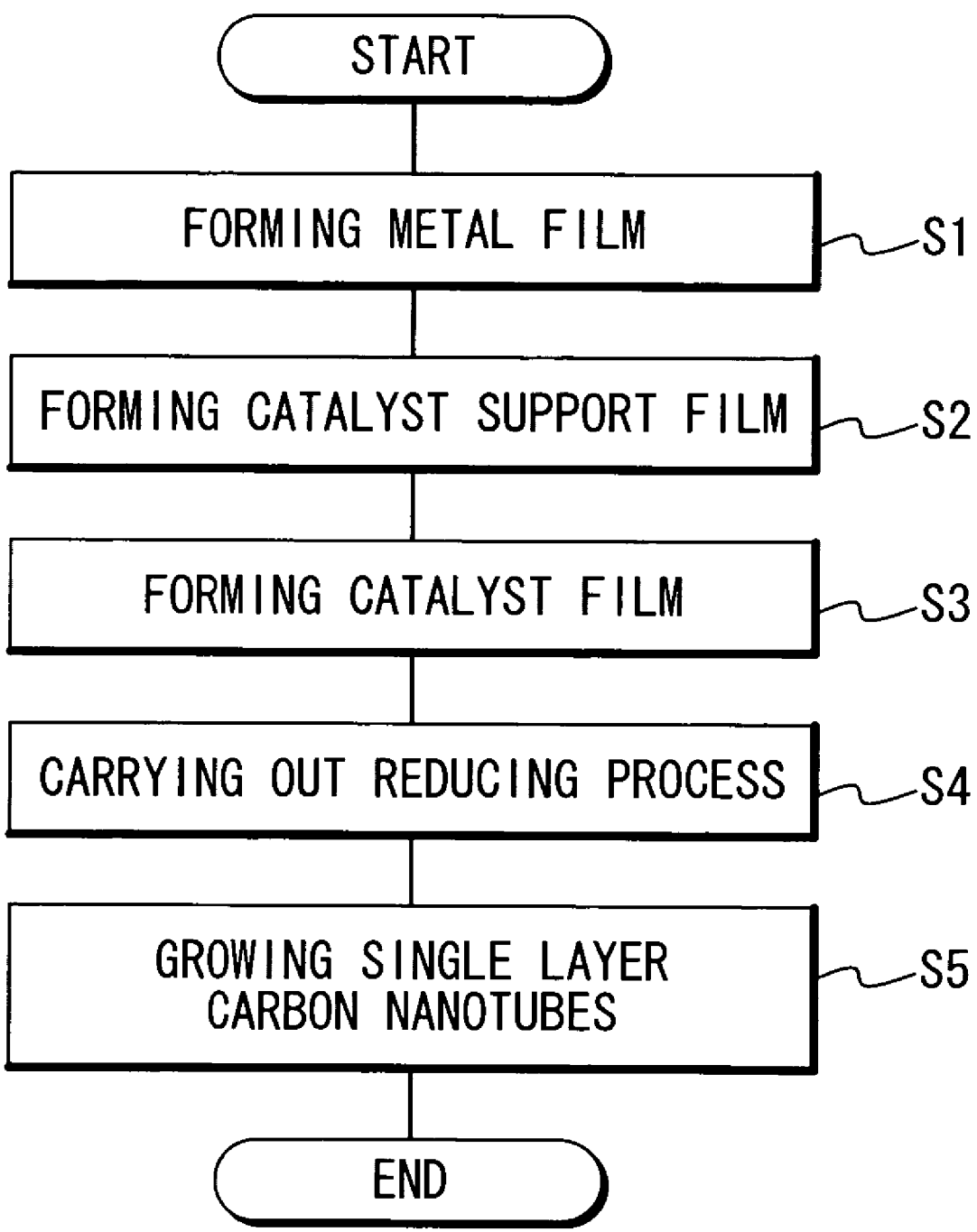

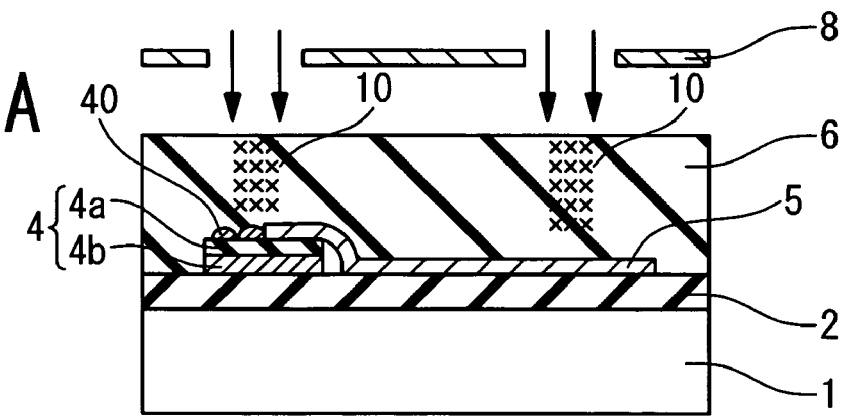
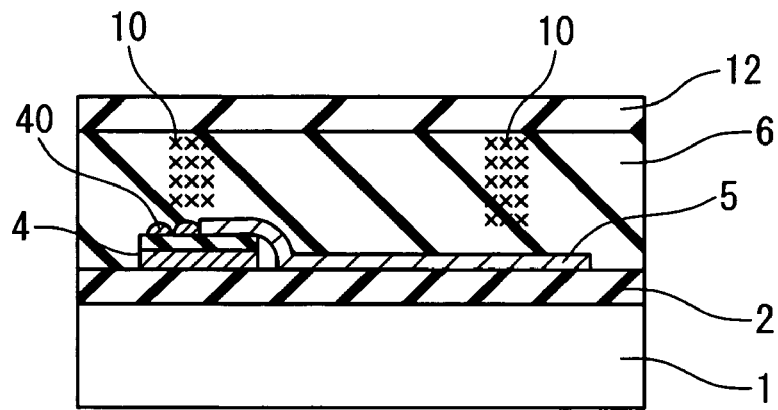
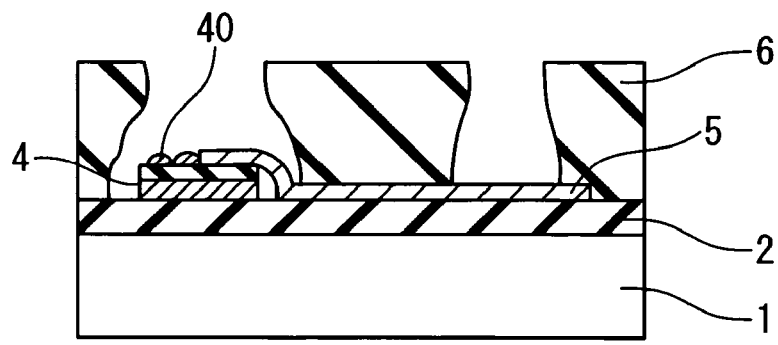
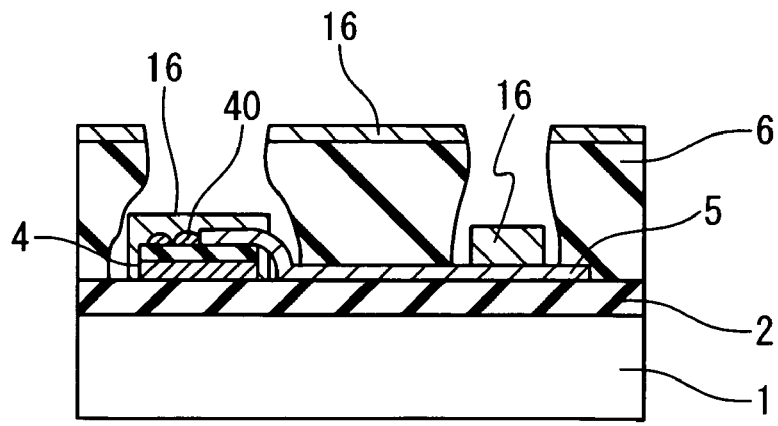

Fig. 13A
Fig. 13B
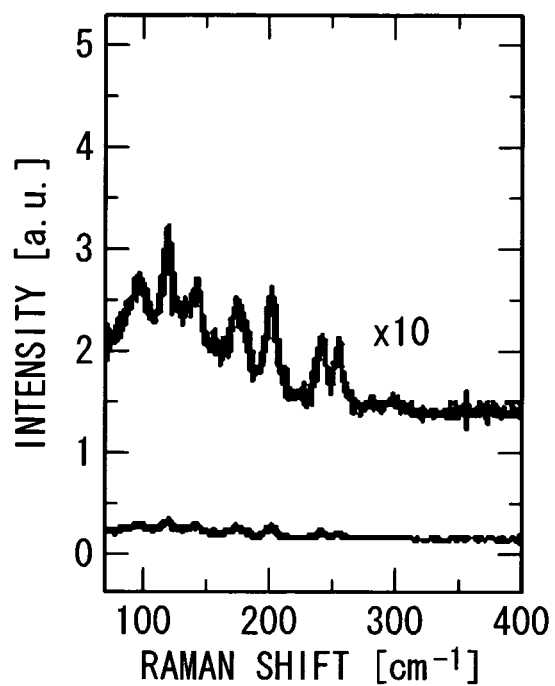
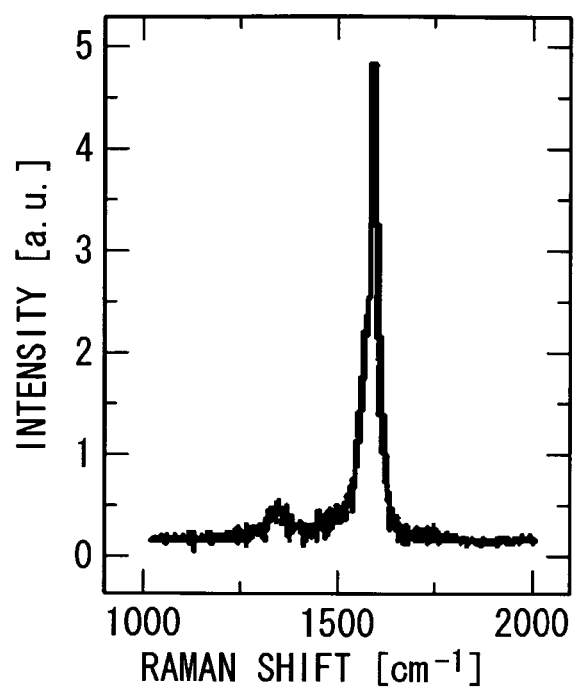

Fig. 19A
Fig. 19B
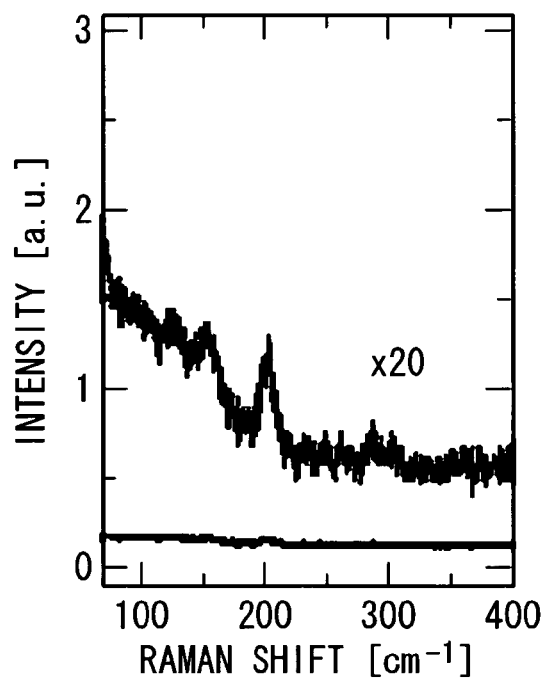
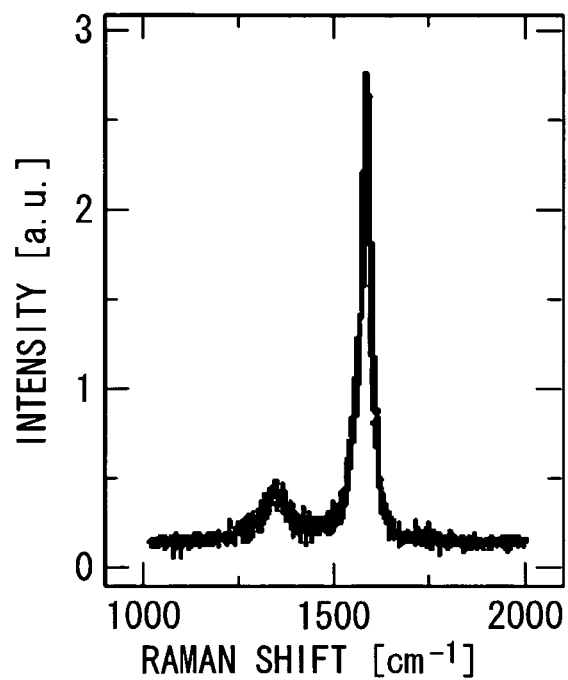

CATALYST SUPPORT SUBSTRATE, METHOD FOR GROWING CARBON NANOTUBES USING THE SAME, AND THE TRANSISTOR USING CARBON NANOTUBES

TECHNICAL FIELD

The present invention relates to a catalyst support substrate, and a method for growing carbon nanotubes using the same, and a transistor using carbon nanotubes

BACKGROUND ART

As a method for manufacturing single-wall carbon nanotubes with high quality, a chemical vapor deposition (CVD) method is expected to be a promising technique. This is because the control of catalyst exhibits the possibility of being able to control the growth of the single-wall carbon nanotubes.

Typically, manufacturing the single-wall carbon nanotubes requires the catalyst metal, such as iron, cobalt and nickel in addition to a carbon material. In the method for manufacturing the single-wall carbon nanotubes based on a conventional vapor phase growth, the nano-particle (fine particle) of metallic oxide such as alumina or silica, or the material having porosity structure such as zeolite is used as the support of the catalyst. This support together with the salt such as the salt of iron is dissolved into solvent, and the catalyst solution is adjusted. After that, this catalyst solution is coated and dried on a substrate, and used as the catalyst for formation of the single-wall carbon nanotubes.

Nature, Vol. 395, Page 878, (1998) discloses the example of using iron nitrate 9-hydrate (Fe(NO3)3.9H2O) and molybdenum acetylacetonate (Mo(acac)2) as the catalyst salts and using the catalyst solution of using alumina nano particle as the support. Then, the single-wall carbon nanotubes are synthesized with methane gas as a carbon supply source. Also, as another example, Chemical Physics Letter, Vol. 296, Page 195, (1998) discloses a method for CVD-growing the single-wall carbon nanotubes by using the catalyst solution, in which the salt of iron, the salt of Mo and alumina nano-particle are respectively used as the catalyst and the support, with CO as a carbon supply source.

However, in the method for using the catalyst solution as mentioned above, it is difficult to selectively grow the single-wall carbon nanotubes. In order to form the catalyst having a predetermined pattern, resist having a predetermined opening is used as mask. As such a method, for example, there are the following two methods.

The first method is a so-called lift-off method. At first, the resist is formed over silicon substrate surface. After that, the resist on the place where the carbon nanotubes will be formed is removed. Next, the catalyst solution is coated over the substrate surface and dried. After that, the substrate is dipped into the solvent of the resist so that the catalyst deposited on the resist is removed together with the resist. This method is typically used in patterning the metallic thin film.

In the second method, firstly, the catalyst solution is coated over the substrate and dried. After that, the resist is coated on the substrate. In succession, the patterning is performed on the resist. In this case, the resist on the portion where the carbon nanotubes will be grown is left. After that, a proper method is used to remove the portion of the catalyst which is not covered with the resist.

However, the case of the first method needs to use the solution which can not solve the resist, as the solvent of the catalyst solution. Also, it was very difficult to deposit the catalyst with a desirable thickness on the portion, in which the resist of the resist pattern does not exist. Actually, the example of dissolving the nano-particles of the alumina, the iron nitrate 9-hydrate (Fe(NO3)3.9H2O) and the molybdenum acetylacetonate (Mo(acac)2) in methanol, and patterning a poly-methyl methacrylate (PMMA) resist is described in the above-mentioned Nature, Vol. 395, Page 878, (1998). However, in this method, the edge portion of the patterned catalyst is unclear. In addition, the pattern of the resist is not also reflected in the pattern of the catalyst. From this fact, it is understood that the method of using the nano-particle has the problem in the control property of the pattern formation.

Also, in the case of using the second method, the dry etching or the wet etching may be considered as the method of removing the catalyst and support in the portion where the carbon nanotubes are not formed. However, the etching resistance of the resist is lower than the iron and the alumina. Thus, currently, it is difficult to etch the iron and the alumina while keeping the pattern of the resist.

Moreover, in the above-mentioned first and second methods, in addition to the above-mentioned problems, the adhesive property between the catalyst support film and the substrate is not sufficiently obtained. Hence, they have the problem that the catalyst support film is easily stripped.

As the method for solving the problems in the method of using such solutions, a method for growing the carbon nanotubes is known, in which the carbon nanotubes are grown from the catalyst film formed on the substrate by using the dry process such as the depositing method. The conventional technique for forming the catalyst thin film by using the dry process will be described below.

The Japanese Laid Open Patent Application JP 2001-20072A relates to a method for forming a large quantity of high purity carbon nanotubes, which are vertically arrayed on a substrate, at a low temperature equal to or less than a deformation temperature of a large area substrate. This gazette describes the process for forming a catalyst metal film on the substrate, then forming the catalyst metal particles of nano-size which are separated by etching the catalyst metal film, and continuously forming a plurality of carbon nanotubes arrayed on the substrate by using a thermal chemical vapor deposition method. The insulating film, such as silicon oxide film, alumina film or the like, may be formed, in order to protect silicide film from being formed by the mutual reaction between the catalyst metal film and the substrate, on the lower portion of the catalyst metal film.

Also, Japanese Laid Open Patent Application JP 2002-115070A and Japanese Laid Open Patent Application JP 2002-115071A describe a technique for forming the thin film of non-catalyst metal, such as Ni and Cu, as a foundation layer, then forming the catalyst metal thin film, such as Fe and Co, in a predetermined pattern thereon, and continuously growing a graphite nano-fiber on this thin film pattern. According to this gazette, alloying is generated between the catalyst metal thin film and the non-catalyst metal, and the adhesive property between both of the thin films is improved, and the adhesive property between the foundation layer and the substrate is also improved. Also, Japanese Laid Open Patent Application JP 2002-115071A discloses a structure in which a thin film pattern of Fe is formed on a Ni thin film, and the carbon nanotubes are formed only on this Fe pattern.

However, in the techniques described in the above-mentioned gazettes, it was not always easy to obtain the sufficiently high yield. Recently, the fact that when iron thin film is deposited on a sapphire single crystal substrate, the single-wall carbon nanotubes can be grown is announced by the inventor of the present invention (contributed to Chemical Physics Letters (2002)). This fact indicates that the growth of the single-wall carbon nanotubes is influenced by the substance supporting the catalyst, namely, the synergistic effect between the support and the catalyst metal has the important meaning. However, in the techniques described in the above-mentioned gazettes, the foundation layer for carrying the catalyst is not designed from the viewpoint of the yield of the carbon nanotubes as mentioned above. The foundation layer is formed from the viewpoint of the protection of the silicide reaction (Japanese Laid Open Patent Application JP 2001-20072A) or the improvement of the adhesive property between the catalyst metal and the substrate (Japanese Laid Open Patent Application JP 2002-115070A and Japanese Laid Open Patent Application JP 2002-115071A), respectively. Thus, the conventional techniques still have the room for the improvement, with regard to the point that the carbon nanotubes are grown at the high yield.

Also, all of the techniques described in the above-mentioned gazettes are intended to be applied to the field of a field emission display and the like. For this reason, so as to be easily applied to a device, multi-wall carbon nanotubes are grown in a direction vertical to the substrate. Thus, they did not give the useful knowledge to the technique for applying to the device, in which the carbon nanotubes are grown in a direction horizontal to the substrate, especially, to the technique for using the single-wall carbon nanotubes.

On the other hand, recently, the development of the transistor using the single-wall carbon nanotubes has been vigorously performed. The transistor of a top gate type using the single-wall carbon nanotubes is described in APPLIED PHYSICS LETTERS, VOLUME 80, NUMBER 20, 20 MAY 2002.

This transistor has a source electrode, a drain electrode and a single-wall carbon nanotubes placed between them, and has the configuration that a gate electrode is formed on these carbon nanotubes.

This transistor is manufactured through the following steps. At first, the silicon oxide film is formed on the silicon substrate, and the carbon nanotubes are dispersed thereon. For example, the carbon nanotubes dispersed in the solution are spin-coated on the silicon oxide film. Next, a probe of AFM (Atomic Force Microscope) is used to determine the position of the carbon nanotubes. After that, electronic beam exposure is carried out to generate the source electrode and the drain electrode. Titanium is used for the configured insulation film of the source electrode and drain electrode. After the source electrode and drain electrode formation, annealing is carried out to form TiC. Consequently, the adhesive property between the source electrode and drain electrode and the carbon nanotubes is improved. After that, the insulating film is formed on the source electrode, the drain electrode and the carbon nanotubes, and the gate electrode is further formed thereon. As mentioned above, the transistor using the carbon nanotubes is completed.

However, in this transistor, it was difficult to maintain the contact resistance between the source and drain electrodes and the carbon nanotubes at a stable low resistance. In the above-mentioned conventional technique, this point is improved by using the titanium as the electrode material and trying the alloying with the carbon nanotubes. However, in order to attain the fast operable transistor, the much lower contact resistance is desired. Also, the conventional technique, since requiring the complex steps to position the carbon nanotubes, still have the room for the improvement with regard to the point of the yield.

In conjunction with the above description, Japanese Laid Open Patent Application JP 2002-105765A discloses the technique of a method for manufacturing carbon nano-fiber composite and carbon nano-fiber. This technique is intended to grow a high dense carbon nano-fiber on a substrate surface.

The method for manufacturing the carbon nano-fiber in this technique firstly reduces the substrate having the interphase of transition metal and interphase of hard reducing metal oxide in reduced atmosphere to extract the transition metal in the interphase, next brings carbon inclusion gas into contact with the extracted transition metal, and then grows the carbon nano-fiber from the extracted transition metal. The substrate having the interphase may be formed by heating the mixed powder containing the oxide powder having the transition metal and the hard reduced metal oxide power up to a reaction temperature.

Japanese Laid Open Patent Application JP 2002-180252A discloses the technique of the method of manufacturing the carbon nanotubes. This method is intended to provide the method for manufacturing the carbon nanotubes grown in a uniform direction on a substrate, in the method for the carbon nanotubes based on the CVD method.

In the method for manufacturing the carbon nanotubes in this technique, the carbon nanotubes are formed on the active substrate by sending the gas of organic carbon raw material onto the active substrate and thermally dissolving it at a temperature between 1100 and 1250° C., wherein the active substrate is formed by depositing the catalyst metal on the substrate at a rate of 0.001 to 0.005 mol/m$^2$. The catalyst metal may be at least one kind selected from Pd, Fe, Co and Ni.

Japanese Laid Open Patent Application JP 2002-146534A discloses the technique of the method for manufacturing the carbon nanotubes. This technique is intended to enable the carbon nanotubes to be arrayed flatly and uniformly at the high dense and also enable the arrayed situation to be easily controlled.

The method for manufacturing the carbon nanotubes in this technique firstly forms a metallic ultra thin film of an iron group metal on an insulting substrate, next charges the insulating substrate and the metallic ultra thin film electrically, then heats and melts the metallic ultra thin film, continuously forms the ultra fine particles separated from each other made of the metal constituting the metallic ultra thin film on the insulating substrate, next decreases the temperatures of the ultra fine particles of the metal and the insulating substrate, then solidifies the ultra fine particles, consequently fixes on the insulating substrate, next discharges electrically the insulating substrate and the ultra fine particle, then supplies the carbon to the insulating substrate and the ultra fine particle by using a vapor growing method, and consequently forms the carbon nanotubes having the metallic ultra fine particle at a tip. The iron group metal may be Ni.

Japanese Laid Open Patent Application JP 2001-176431A discloses a field emission display element and a method for manufacturing the same. This technique is intended to provide the field emission display element that uses the carbon nanotubes which are vertically oriented.

The method for manufacturing the field emission display element in this technique includes: a step of forming a first metal film for a cathode electrode on a lower substrate; a step of growing the vertically oriented carbon nanotubes on the first metal film; a step of placing a first spacer on the first metal film; a step of forming a second metal film as a gate electrode in a shape of mesh heldby the first spacer and formedon the carbon nanotubes; a step of forming a second spacer on the first spacer; and a step of attaching the upper substrate, on which a transparent electrode and a fluorescent material are deposited, on the second spacer. The first metal film may be a chrome film, a tungsten film or an aluminum film, and the second metal film may be a chrome film or a palladium film. The catalyst metal film may be made of cobalt, nickel, iron, yttrium or the alloy of them.

Japanese Laid Open Patent Application JP 2001-48512A discloses a technique of a method for manufacturing a vertically oriented carbon nanotubes. This technique is intended to provide the method that can directly form the carbon nanotubes on the substrate, and control the average values of diameters and lengths of the carbon nanotubes, and further orient the carbon nanotubes vertically to the substrate and selectively manufacture on the substrate or any portion on the substrate.

The method for manufacturing the carbon nanotubes in this technique manufactures the carbon nanotubes oriented in the direction vertical to the substrate surface on the substrate surface by using a plasma CVD method. The substrate may be made of Ni, Fe and Co or the alloy composed of at least two kinds of those metals.

DISCLOSURE OF INVENTION

Therefore, an object of the present invention is to stably form carbon nanotubes patterned in the shape based on the design on a substrate surface.

Also, another object of the present invention is to improve an adhesive property of a catalyst containing film to a substrate.

Still another object of the present invention is to improve a patterning property of the catalyst containing film.

Still another object of the present invention is to provide a technique for generating the carbon nanotubes, especially, the single-wall carbon nanotubes extended in a direction horizontal to the substrate, at a high yield.

Still another object of the present invention is to provide an electronic element such as a transistor, which is excellent in high-speed operation property and high-integrated property, by using the carbon nanotubes.

In order to achieve an aspect of the present invention, the present invention provides a catalyst supporting substrate including: a first region which is formed on a substrate; and a second region which is formed covering a part of the first region. The first region includes a catalyst supporting portion containing a first material. The second region includes a catalyst portion containing a second material which is different from the first material. The first material includes a metal containing at least one of elements selected from the second group to the fourteenth group of the periodic table or a compound thereof. The second material is a catalyst which grows carbon nanotubes in a vapor phase.

In the catalyst supporting substrate, the carbon nanotubes include single-wall carbon nanotubes.

In the catalyst supporting substrate, the second material includes a metal containing at least one of elements selected from a group consisting of Fe, Ni, Co, Ru, Rh, Pd, Os, Ir, Pt, La, Y, Mo and Mn or a compound thereof.

In the catalyst supporting substrate, the first material includes a metal containing at least one of elements selected from a group consisting of Al, Mo, Ti, Ta, Cr, Cu, Mn, Mg, Zr, Hf, W, Ru, Rh, Zn and Sn or a compound thereof.

In the catalyst supporting substrate, the first region includes a metal film which contains the first material and is formed on the substrate. The catalyst supporting portion includes a film that an upper portion of the metal film is oxidized or hydroxylated.

In the catalyst supporting substrate, the second material includes a metal containing at least one of elements selected from a group consisting of Fe, Ni, Co, Ru, Rh, Pd, Os, Ir, Pt, La, Y, Mo and Mn or a compound thereof.

In the catalyst supporting substrate, the first first material includes a metal containing at least one of elements selected from a group consisting of Al, Mo, Ti, Ta, Cr, Cu, Mn, Mg, Zr, Hf, W, Ru, Rh, Zn and Sn or a compound thereof.

In the catalyst supporting substrate, a surface of the catalyst supporting portion includes at least one selected from aluminum natural oxide film, boehmite, α alumina, γ alumina, δ alumina, and θ alumina.

In order to achieve another aspect of the present invention, the present invention provides a transistor including: a catalyst, the carbon nanotubes, a first electrode, a second electrode and a gate electrode. The catalyst containing film is placed on a substrate and grows carbon nanotubes in a vapor phase. The carbon nanotubes are extended in the direction along a surface of the substrate from the catalyst containing film. The first electrode is connected to a part of the catalyst containing film side of the carbon nanotubes. The second electrode is connected to a part of another side of the carbon nanotubes. The gate electrode applies a voltage to the carbon nanotubes between the first electrode and the second electrode.

In the transistor, the carbon nanotubes includes single-wall carbon nanotubes.

In the transistor, the gate electrode is placed on an upper portion of the carbon nanotubes.

In the transistor, the gate electrode is placed on a rear surface of the substrate.

In the transistor, the second electrode is formed so as to be separated from the first electrode and surround a periphery of the first electrode.

In the transistor, the catalyst containing film includes: a first region which is formed on a substrate; and a second region which is formed covering a part of the first region. The first region includes a catalyst supporting portion containing a first material. The second region includes a catalyst portion containing a second material which is different from the first material. The first material includes a metal containing at least one of elements selected from the second group to the fourteenth group of the periodic table or a compound thereof. The second material is a catalyst which grows carbon nanotubes in a vapor phase.

In the transistor, the second material includes a metal containing at least one of elements selected from a group consisting of Fe, Ni, Co, Ru, Rh, Pd, Os, Ir, Pt, La, Y, Mo and Mn or a compound thereof.

In the transistor, the first first material includes a metal containing at least one of elements selected from a group consisting of Al, Mo, Ti, Ta, Cr, Cu, Mn, Mg, Zr, Hf, W, Ru, Rh, Zn and Sn or a compound thereof.

In the transistor, the first region includes a metal film which contains the first material and is formed on the substrate. The catalyst supporting portion includes a film that an upper portion of the metal film is oxidized or hydroxylated.

In the transistor, the second material includes a metal containing at least one of elements selected from a group consisting of Fe, Ni, Co, Ru, Rh, Pd, Os, Ir, Pt, La, Y, Mo and Mn or a compound thereof.

In the transistor, the first first material includes a metal containing at least one of elements selected from a group consisting of Al, Mo, Ti, Ta, Cr, Cu, Mn, Mg, Zr, Hf, W, Ru, Rh, Zn and Sn or a compound thereof.

In order to achieve still another aspect of the present invention, the present invention provides a method for growing carbon nanotubes including: (a) providing a catalyst supporting substrate; and (b) growing the carbon nanotubes by supplying raw material gas containing carbon to a catalyst supporting substrate. The catalyst supporting substrate includes: a first region which is formed on a substrate; and a second region which is formed covering a part of the first region. The first region includes a catalyst supporting portion containing a first material. The second region includes a catalyst portion containing a second material which is different from the first material. The first material includes a metal containing at least one of elements selected from the second group to the fourteenth group of the periodic table or a compound thereof. The second material is a catalyst which grows carbon nanotubes in a vapor phase.

In the method for growing carbon nanotubes, the carbon nanotubes include single-wall carbon nanotubes.

In the method for growing carbon nanotubes, the step (b) includes: (b1) growing the carbon nanotubes in the direction along a surface of the catalyst supporting substrate.

In the method for growing carbon nanotubes, the step (b1) includes: (b11) applying an electric field with the predetermined direction to the catalyst supporting substrate.

In the method for growing carbon nanotubes, the step (b) includes: (b2) bringing reducing gas into contact with a surface of the catalyst supporting substrate.

In the method for growing carbon nanotube, the step (a) includes: (a1) forming the first region and the second region which are patterned with predetermined shapes on the substrate.

In the method for growing carbon nanotubes, the carbon nanotubes include single-wall carbon nanotubes.

In the method for growing carbon nanotubes, the second material includes a metal containing at least one of elements selected from a group consisting of Fe, Ni, Co, Ru, Rh, Pd, Os, Ir, Pt, La, Y, Mo and Mn or a compound thereof.

In the method for growing carbon nanotubes, the first first material includes a metal containing at least one of elements selected from a group consisting of Al, Mo, Ti, Ta, Cr, Cu, Mn, Mg, Zr, Hf, W, Ru, Rh, Zn and Sn or a compound thereof.

In the method for growing carbon nanotubes, the step (a1) includes: (a11) forming a catalyst supporting portion which are patterned with predetermined shape on the substrate, and (a12) forming a catalyst portion which covers a part of a surface of the catalyst supporting portion.

In the method for growing carbon nanotubes, step (a11) includes: (a111) forming a metal film which contains at least one of elements selected from the second group to the fourteenth group of the periodic table, and (a112) forming the catalyst supporting portion by oxidizing or hydroxylating an upper portion of the metal film.

In the method for growing carbon nanotubes, the step (a12) includes: (a121) forming the catalyst portion by any one of methods of a deposition method, a sputtering method and a CVD method.

In the method for growing carbon nanotubes, the step (b) includes: (b3) growing the carbon nanotubes in the direction along a surface of the catalyst supporting substrate by applying an electric field with the predetermined direction to the catalyst supporting substrate.

In the method for growing carbon nanotube, the step (b) includes: (b4) bringing reducing gas into contact with a surface of the catalyst supporting substrate.

In order to achieve still another aspect of the present invention, the present invention provides a method for manufacturing a transistor including: (c) forming a catalyst containing film, which is patterned with a predetermined shape, on a semiconductor substrate; (d) growing the carbon nanotubes in the direction along a surface of the semiconductor substrate by supplying raw material gas containing carbon to the catalyst containing substrate; (e) forming a first electrode which is connected to a part of the catalyst containing film side of the carbon nanotubes and a second electrode which is connected to a part of another side of the carbon nanotubes; and (f) forming a gate electrode which applies a voltage to the carbon nanotubes between the first electrode and the second electrode. The catalyst containing film includes: a first region which is formed on a substrate; and a second region which is formed covering a part of the first region. The first region includes a catalyst supporting portion containing a first material. The second region includes a catalyst portion containing a second material which is different from the first material. The first material includes a metal containing at least one of elements selected from the second group to the fourteenth group of the periodic table or a compound thereof. The second material is a catalyst which grows carbon nanotubes in a vapor phase.

The catalyst support substrate according to the present invention can preferably grow carbon nanotubes, especially, single-wall carbon nanotubes and obtain the high yield, since having the surface where a first region including the metal containing the particular element or the compound thereof and a second region including a carbon nanotube vapor phase growth catalyst are exposed. The second region of this substrate has a property of decomposing the carbon compound served as the raw material gas of the carbon nanotube growth. The high yield is considered to be attained by the synergistic effect between this property and the above-mentioned catalyst. Also, the second region has a property of strongly adhering the catalyst and the substrate, which enables to obtain the carbon nanotubes stably arranged on the substrate.

Also, the method for growing the carbon nanotubes according to the present invention can stably obtain the carbon nanotubes of the high quality, especially, the single-wall carbon nanotubes at the high yield. The obtained carbon nanotubes are excellent in the adhesive property to the substrate and can be preferably applied to the electronic device, such as the transistor excellent in the high-speed operation property and high-integrated property and the like.

Also, the transistor according to the present invention is excellent in the adhesive property between the carbon nanotubes and the electrodes. When the carbon nanotubes are assumed to be the single-wall carbon nanotubes, the device property excellent in the high-speed operation property can be stably obtained. In addition, since the channel current flowing through the carbon nanotubes is largely changed by applieing voltage, the ideal transistor can be obtained.

Moreover, the method for manufacturing the transistor according to the present invention, can obtain the transistor having the excellent high speed operation property and high reliability at the excellent manufacturing stability, since forming the carbon nanotube portion by using the method for growing the carbon nanotubes as mentioned above.

In the present invention, since both of the catalyst film and the catalyst support film can be easily patterned by etching, the device of the desired shape can be formed at the good yield.

BRIEF DESCRIPTION OF DRAWINGS

FIG. 1 is a flowchart showing a film forming process of the method for growing the carbon nanotubes in the first embodiment of the present invention;

FIG. 8A to FIG. 8D, FIG. 9A to FIG. 9D and FIG. 10A to FIG. 10D are sectional views showing the method for manufacturing the transistor shown in FIG. 3A and FIG. 3B;

FIG. 13A and FIG. 13B are Raman spectra of the sediment in FIG. 11;

FIG. 19A and FIG. 19B are the Raman spectra of the carbon nanotubes shown in FIG. 18.

BEST MODE FOR CARRYING OUT THE INVENTION

Figure 2A:
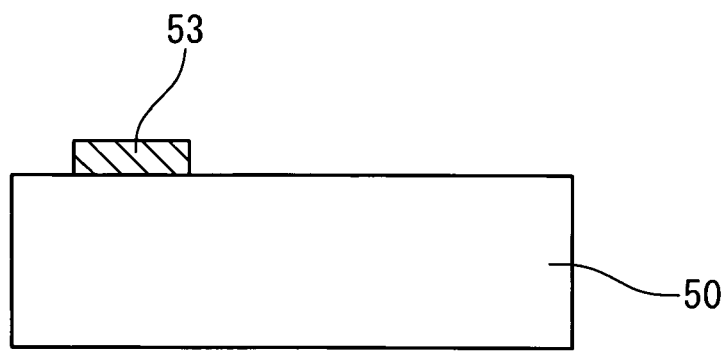
FIG. 2A to FIG. 2E are sectional views showing an example of the film forming process in FIG. 1.
Figure 2B:
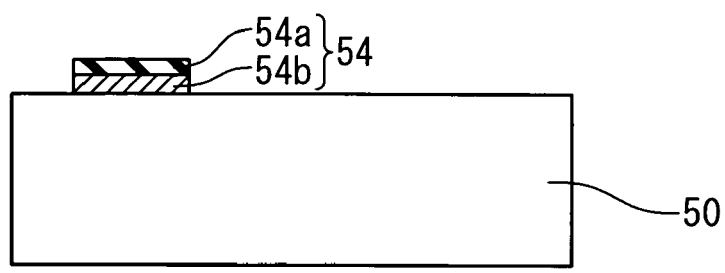
Figure 2C:
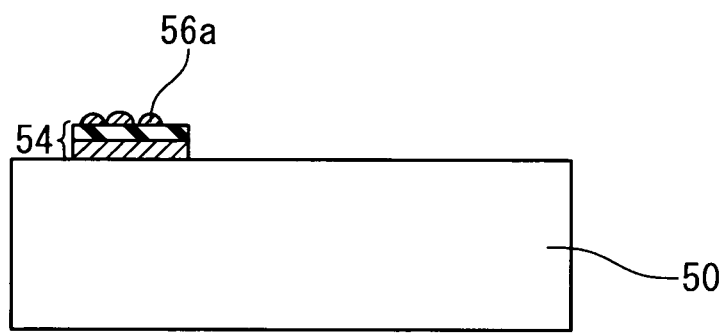
Figure 2D:
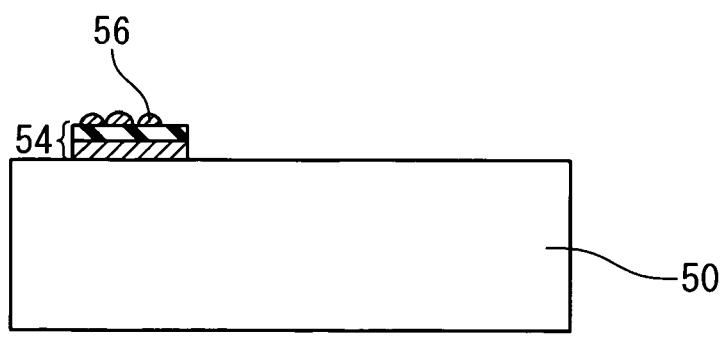
Figure 2E:
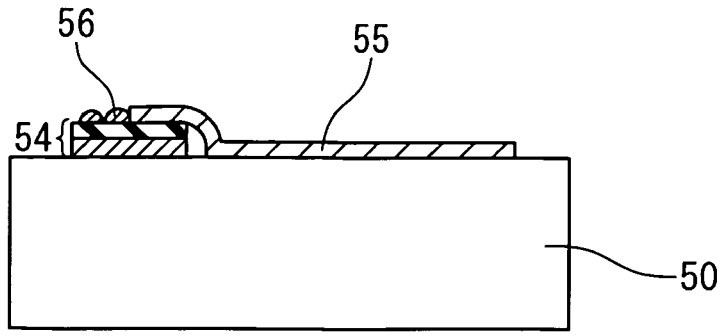

The embodiment of a catalyst support substrate, a method for growing carbon nanotubes, and a transistor using the carbon nanotubes will be described below with reference to the drawings.

In the present invention, the carbon nanotubes may be any of single-wall carbon nanotubes and multi-wall carbon nanotubes. In the case of the single-wall carbon nanotubes, it can be preferably applied to an electronic device requiring a high-speed operation property such as a transistor.

In the present invention, the surface of a catalyst containing film includes:

(a) a first region containing a vapor phase growth catalyst for carbon nanotubes; and (b) a second region containing metals including one or more elements selected from the second group to fourteenth group of the periodic table or the compounds thereof (except for the substance selected as the vapor phase growth catalyst of carbon nanotubes in the first region).

Thus, the adhesive property to the substrate and the patterning property of the catalyst containing film can be improved. In addition, the carbon nanotubes can be generated on the surface of the catalyst containing film at a high yield.

Here, as the vapor phase growth catalyst for the carbon nanotubes in the first region, the single metal which is one of the iron group such as Ni, Fe and Co, the platinum group such as Pd, Pt and Rh, the rare earth metal such as La and Y, or the transition metal such as Mo and Mn, the alloy including any of them or the compound including any of them is exemplified. Among these, it is desired to use the metal or compound having the element of at least one kind selected from the group consisting of Fe, Ni, Co, Ru, Rh, Pd, Os, Ir, Pt, La, Y, Mo and Mn.

Also, as the metal or compound constituting the second region, that including the element of at least one kind selected from the group consisting of Al, Mo, Ti, Ta, Cr, Cu, Mn, Mg, Zr, Hf, W, Ru, Rh, Zn and Sn is exemplified. Among them, it is desired to use Al, Mo, Ti, Ta and Mg, and the oxide or hydroxide containing them. Using such materials, the carbon nanotubes, especially, the single-wall carbon nanotubes can be obtained at the high yield.

In the present invention, the catalyst containing film, in which the catalyst support film corresponding to the second region and the catalyst film corresponding to the first region are laminated, is formed. Then, the carbon nanotubes are grown from this catalyst containing film. In this case, the catalyst film is formed so as to cover a part of the catalyst support film. Those films can be formed by using the depositing method, sputtering method or CVD method.

If such configuration is employed, the catalyst support film includes: the metal film containing one or more elements selected from the second group to fourteenth group of the periodic table; and the film in which the upper portion of this metal film is oxidized or hydroxylated. In this case, the metal oxide film or metal hydroxide film becomes the catalyst support. The interposition of the metal film between the catalyst support and the substrate causes the adhesive property to the substrate to be excellent. In addition, the film quality of the catalyst support becomes excellent. As a result, the carbon nanotubes, in which the adhesive property to the substrate is excellent and the electric property is excellent, can be formed on the substrate at the high yield.

Also, the employment of the above-mentioned configuration obtains the following merits on the process.

Firstly, after the metal film is formed, it is patterned into a predetermined shape. After that, the upper portion of the metal film can be oxidized or hydroxylated. Thus, the patterning can be executed accurately and easily.

Secondly, the film qualities of the metal oxide film and metal hydroxide film become excellent, and the control property of the film thickness is improved. For example, when the metal oxide film or metal hydroxide film is formed by the sputtering method, there may be a case that the constituent atom such as an oxygen atom is removed which disables the film with desired composition to be obtained. The employment of the above-mentioned configuration enables such composition change to be reduced.

Thirdly, by suitably adjusting the treating condition of the oxidization or hydroxylation, the structure of the oxide film or hydroxide film can be controlled. Thus, the yield of the carbon nanotubes can be adjusted. Thus, for the device region where the yield is desired to be increased and the device region where the yield is desired to be contrarily decreased, the carbon nanotubes can be formed at the desired densities, respectively. The reason why the yield of the carbon nanotubes is changed by the structure control of the oxide film or hydroxide film is not always evident. However, it is speculated that the fact has influence, in which the density and distribution of the acid points such as Lewis acid points are varied inside those films.

As the actual example of the above-mentioned configuration, the configuration is exemplified, in which as the catalyst support film, aluminum film is placed in a lower layer, and the film containing the oxide aluminum is formed on the upper layer thereof. Here, as the oxide aluminum, at least one selected from aluminum natural oxide film, boehmite, α alumina, γ alumina, δ alumina, and θ alumina. In the case of such structure, the above-mentioned merits become outstanding.

In the transistor of the present invention, the gate electrode is placed at a position where electric field is generated in the carbon nanotubes. Such a position is exemplified as the upper portion of the carbon nanotubes, the adjacent portion inside the same plane as the carbon nanotubes, and the rear of the substrate.

In the transistor of the present invention, in the first and second electrodes, one functions as a source electrode, and the other functions as a drain electrode. The arrangement of the first and second electrodes may have various shapes. The arrangement may be such that the first and second electrodes are separated and the gate electrode is placed between them. Also, the arrangement may be such that the second electrode is formed so as to be separated from the first electrode and surround a part of the periphery of the first electrode or the whole thereof.

First Embodiment

The first embodiment of the present invention will be described below with reference to the attached drawings.

This embodiment relates to a method for growing the carbon nanotubes in the present invention (the method for growing the single-wall carbon nanotubes in the direction horizontal to the substrate).

FIG. 1 is a flowchart showing a film forming process of the method for growing the carbon nanotubes in the first embodiment of the present invention. At first, the metal film composed of a first metal is formed on a substrate (Step S1). After that, the surface is oxidized or hydroxylated to form the catalyst support film including the metal oxide or metal hydroxide (Step S2). Next, the catalyst film including a second metal or the compound of that metal is formed on this catalyst support film surface (Step S3). In succession, reducing gas is brought into contact with the substrate surface including the catalyst film, and a reducing process is carried out (Step S4). Then, the carbon raw material supplied onto the catalyst film is thermally decomposed in the vapor phase, and the single-wall carbon nanotubes are grown (Step S5).

FIG. 2A to FIG. 2E are sectional views showing an example of the film forming process in FIG. 1. FIG. 2A corresponds to the step S1, FIG. 2B corresponds to the step S2, FIG. 2C corresponds to the step S3, FIG. 2D corresponds to the step S4, and FIG. 2E corresponds to the step S5.

A substrate 50 used in this embodiment can use the insulating crystal substrate such as silicon, quartz, sapphire and MgO, the insulating amorphous substrate such as alumina and glass, or the other metal substrates. In this embodiment, the substrate 50 is desired to be stable at a temperature of 500° C. or more. This is because it is necessary to endure the thermal treatment in growing a carbon nanotubes 55 and the thermal treatment executed to obtain the oxide or hydroxide serving as the catalyst support.

In this embodiment, as the first metal, for example, it is possible to use the metal including the element of at least one kind selected from the group consisting of Al, Mo, Ti, Ta, Cr, Cu, Mn, Mg, Zr, Hf, W, Ru, Rh, Zn and Sn. The film of the first metal is a first metal film 53. A catalyst support film 54 is the film such that the surface of the first metal film 53 is oxidized or hydroxylated. The portion treated on the surface becomes a catalyst support layer 54a, and the other portion becomes a foundation layer 54b.

As the second metal, it is possible to use the metal having the catalyst action in growing the single-wall carbon nanotubes 55 by the vapor phase thermal decomposition growth. For example, it is possible to use the metal or compound including any one or more kind of the iron group such as Ni, Fe, Co and the like, the palladium group such as Pd, Pt, Rh and the like, the rare earth metal such as La, Y and the like, or the transition metal such as Mo, Mn and the like. A catalyst film 56a is the film including the second metal. The catalyst film 56a is reduced (deoxidized) so as to be a catalyst film 56.

In this embodiment, the combination of the catalyst film 56 and the catalyst support film 54 is important. That is, as the material constituting the catalyst support film 54, the material that can suppress the sintering with the material constituting the catalyst film 56 at the treatment temperature of 500° C. or more. For example, in the combination of the iron (catalyst film 56) and the silicon oxide film (catalyst support film 54), a large number of fine particles shapes of the iron are observed, and the yield of the single-wall carbon nanotubes 55 is very small. As the proper catalyst support film 54 when the iron is used as the catalyst film 56, the oxide aluminum can be exemplified.

The respective steps shown in FIG. 1 will be described below in detail.

(i) Step S1 (FIG. 2A) and Step S2 (FIG. 2B): Formation of Metal Film and Formation of Catalyst Support Film In this embodiment, the first metal film 53 formed on the substrate 50 is oxidized or hydroxylated to form the catalyst support film 54 including the metal oxide or metal hydroxide. The first metal film 53 does not need to have the conventional powder or particle shape, and it can be formed from the flatly formed film. There is no limitation on the shape of the catalyst support film 54 including the metal oxide or metal hydroxide. It may be flat or micro-structured. The portion of the metal oxide or metal hydroxide becomes the catalyst support layer 54a, and the other portion becomes the foundation layer 54b.

The thickness of the first metal film 53 in this embodiment is not especially limited, and can be suitably set based on the requirement for the carbon nanotubes and the design of the device with regard to the first metal film 53. If the surface is oxidized or hydroxylated, for example, the thickness is not limited from about several atomic layer to about several hundreds micrometer.

The catalyst support film 54 is obtained by naturally oxidizing the first metal film 53 or chemically oxidizing or hydroxylating the surface. Here, the surface of the first metal film 53 does not need to be entirely oxidized or hydroxylated. Then, approximately several atomic layers on the surface may be oxidized or hydroxylated. For example, the surface of the aluminum may be exposed to air so that the very thin (about 1 to 10 nm or less) natural oxide film is formed.

As the catalyst support film 54, aluminum containing compound can be also used. It is known that the aluminum surface, when heated in water of 90° C. to 100° C., becomes aluminum hydroxide oxide (boehmite). Also, it is known that the boehmite, when heated to about 600° C., becomes the γ alumina. In short, the γ alumina is one of the alumina types typically called the transition alumina. As the transition alumina, in addition, there are θ alumina, κ alumina, η alumina and the like. They are continuously changed, for example, to γ, δ and θ when it is started from the boehmite and heated to increase the temperature. Then, at about 1200° C., it is finally changed to the stable α alumina having a corundum structure. If such aluminum containing compound is used as the insulating film of the catalyst support film 54, the single-wall carbon nanotubes 55 can be efficiently produced.

Here, from the viewpoint of the yield improvement of the carbon nanotubes 55, the usage of the transition alumina is desired. This is because the synergistic effect of the transition alumina and the catalyst is great. On the other hand, if the α alumina is used, although this has the tendency that the yield is small, the synergistic effect with the catalyst can be sufficiently obtained. Consequently, the single-wall carbon nanotubes 55 can be manufactured.

By using the difference in the synergistic effect caused by the kind of the catalyst support film 54 as mentioned above, the growth of the single-wall carbon nanotubes 55 can be controlled. For example, the α alumina is formed in the portion where the yield of the single-wall carbon nanotubes 55 is desired to be suppressed. Contrarily, the transition alumina is formed in the portion where the yield of the single-wall carbon nanotubes 55 is desired to be greater. Consequently, the yield can be controlled, based on the place.

In this case, by preliminarily processing the boehmite at a high temperature, the α alumina is formed. Next, the aluminum film is formed in the place where the transition alumina is formed. After that, the thermal treatment is performed to convert the aluminum film (or the upper portion thereof) into the boehmite and the transition alumina. This process enables the selectively different alumina to be formed on the same substrate. The temperature, at which the transition alumina is formed, is lower than the temperature, at which the α alumina is formed. Thus, the preliminarily formed α alumina is never deteriorated.

Also, by anode-oxidizing the surface of the aluminum in acid, the alumina can be obtained. As for the alumina formed by the anode oxidation in this way, a part thereof is said to be the γ alumina. This anode oxidation alumina does not need to be micro porous. It may be the shape of a layer to be used as the insulating film.

Also, it can be oxidized by a dry process for exposing the surface of the aluminum to oxygen plasma. Also, by using a scanning tunnel microscope in air, the anode oxidation is performed, thereby the oxide film can be formed selectively.

As mentioned above, the example of the catalyst support film 54 having the structure, in which the aluminum film and the aluminum inclusion compound film are laminated on the substrate 50, has been explained. However, another metal may be used. For example, the catalyst support film 54 having the structure, in which titanium film is formed on the silicon oxide film and then thin oxide film is formed on the surface thereof, may be used. In this case, the natural oxidation in air enables the titanium oxide film to be easily formed. In the case of molybdenum and the iron, they are similar. The catalyst support film 54 having the structure in which the molybdenum and the molybdenum oxide film are laminated in this order on the substrate 50, or the catalyst support film 54 having the structure in which the iron and the iron oxide film are laminated in this order on the substrate 50 can be used.

Those catalyst support films 54 can be also patterned in the situation of the first metal film 53 serving in the former step. This can use a lift-off method which will be described below. That is, at first, resist is coated on the substrate 50. After that, the resist is patterned by using an optical exposing or electronic beam exposing method that is usually used. Next, the first metal film 53 is formed thereon. In succession, the unnecessary portion of the first metal film 53 together with the resist is removed by solvent. Or, the following etching method may be used. That is, at first, the first metal film 53 is formed. After that, the resist is coated on the first metal film 53. Next, the resist is patterned. In succession, the unnecessary portion of the first metal film 53 is etched to be removed.

The process for oxidizing or hydroxylating the first metal film 53 may be executed immediately after the first metal film 53 is formed or after the first metal film 53 is patterned. Also, in any case of the lift-off method and the etching method, after the catalyst film 56 including the second metal film 56a is formed, those methods can be used to pattern the catalyst support film 54 and the catalyst film 56 at the same time. This is a so-called self-aligning method that is used in manufacturing the transistor. In this case, prior to the formation of the catalyst film 56, the first metal film 53 is oxidized or hydroxylated to form the catalyst support film 54.

(ii) Step S3 (FIG. 2C): Formation of Catalyst Film

For the formation of the catalyst film 56, the usual method of forming the metal film can be used. As the film forming method, the deposition or sputtering method is exemplified. They are further desired because they are simple, they can forms uniform films and the formed films can be patterned similarly to the conventional metal patterning method. Also, the film thickness of the catalyst film 56 is desired to be set such that the catalyst support film 54 is not perfectly covered. This is because, if the support is perfectly covered, the synergistic effect based on the combination of the support and the catalyst is extremely reduced. In short, the support prepared as the catalyst support film 54 becomes at the situation similar to the situation having no support. Thus, the film thickness of the catalyst film 56 is desirably adjusted on the basis of the characteristic scale of the structure of the catalyst support film 54. For example, if the boehmite is formed from the aluminum having a thickness of 0.1 μm which will be described later, the structure having the shape of a flower leaf between approximately several hundred nm and several μm is generated. This is related to the volume increase when aluminum is converted into boehmite while oxygen atoms and hydroxyl groups are newly introduced in addition to the aluminum atoms. Thus, the thickness of the catalyst film 56 needs to be suppressed to about several μm to about 10 μm so as not to perfectly embed those boehmites.

Also, with regard to the catalyst metal of the catalyst film 56, for example, the wet process using the solution of iron nitrate 9-hydrate can be used to form the film of the catalyst metal. If such a film forming method is employed, the catalyst can be efficiently formed on the surface of the catalyst support film 54, and the yield of the carbon nanotubes can be improved.

(iii) Step S4 (FIG. 2D): Substrate Surface Reducing Process

Reducing gas is brought contact into the surface of the substrate 50 processed through the above-mentioned steps. As the reducing gas, $H_2$ and $N_2$ are exemplified. Consequently, the yield and quality of the carbon nanotubes 55 can be improved. This process may be properly omitted, based on the situation of the catalyst metal of the catalyst film 56.

(iv) Step S5 (FIG. 2E): Growth of Carbon Nanotubes

The substrate 50 in which the catalyst support film 54 and the catalyst film 56 are formed is placed in a film forming apparatus. After that, the growth atmosphere in the film forming apparatus is heated. The heating is carried out, for example, in inactive atmosphere. As the carbon material, it is possible to use the various kinds of carbon containing substances that are gaseous at the temperature at the growth time. As such carbon containing substances, the substances which are gaseous at a normal temperature such as methane ($CH_4$), ethylene ($C_2H_4$) and carbon monoxide (CO), and the substances which are solid or liquid at the normal temperature and gaseous under the growth temperature such as phenanthrene, benzene, ethanol and methanol are exemplified. Thus, the single-wall carbon nanotubes 55 can be grown in the vapor phase thermal decomposition growth on the surface of the catalyst containing film composed of the above-mentioned catalyst support film 54 and catalyst film 56. At this time, in order to facilitate the reduction of the catalyst metal, since the catalyst action can be improved by supplying the hydrogen simultaneously with the carbon material, thereby the yield of the single-wall carbon nanotubes 55 can be increased.

In supplying the carbon to the catalyst and the catalyst support, in addition to the thermal decomposition growth of the carbon material under the situation that the temperature is set at the high temperature as mentioned above, for example, the following methods can be used. That is, there are: a method of using the plasma of argon and hydrogen and then decomposing the carbon material; and a method of evaporating carbon from the solid including the carbon, such as a carbon bar, by means of laser abrasion.

The using the above-mentioned patterned catalyst and catalyst support enables the selective growth of the single-wall carbon nanotubes. However, the direction of the single-wall carbon nanotubes manufactured at that time is random. It is known that the application of the external field, such as electric field, magnetic field or the like, to the single-wall carbon nanotubes makes the directions equal. Even in the above-mentioned patterned catalyst and catalyst support, the directions can be made equal by applying the external field, such as the electric field, the magnetic field, or the centrifugal force when the substrate is rotated, or the like, when the carbon material is supplied.

Second Embodiment

The second embodiment of the present invention will be described below with reference to the attached drawings. This embodiment relates to the transistor using the carbon nanotubes in the present invention.

Figure 3A:
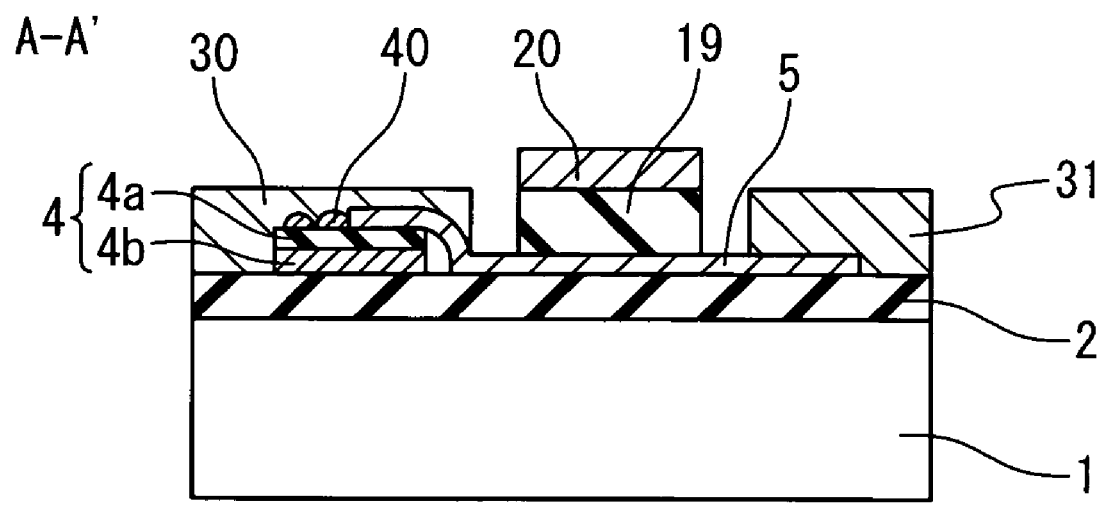
FIG. 3A and FIG. 3B are views showing one example of the structure of the transistor using the carbon nanotubes in the second embodiment of the present invention.
Figure 3B:
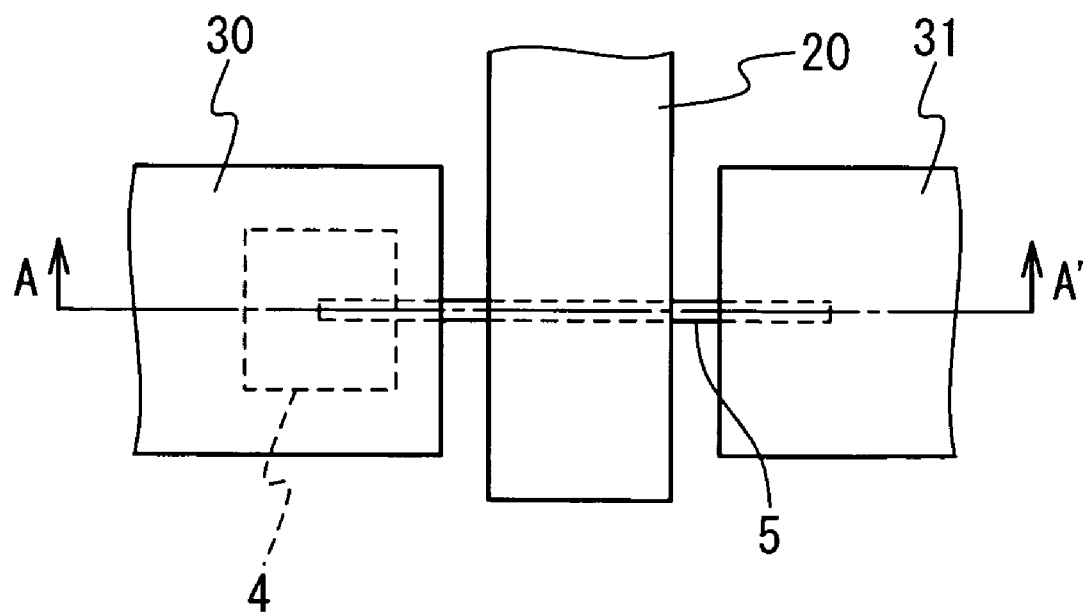

FIG. 3A and FIG. 3B are views showing one example of the structure of the transistor using the carbon nanotubes in the second embodiment of the present invention. FIG. 3B shows a top view of the transistor. FIG. 3A shows a sectional view along the line AA' of FIG. 3B. The transistor in this embodiment has the structure that a silicon oxide film 2 is formed on a silicon substrate 1, and a device portion is formed thereon. The device portion includes: a gate electrode composed of an insulating film 19 and a gate metal film 20; a source electrode 30 and a drain electrode 31 which are formed on both sides thereof; and a carbon nanotubes 5 for connecting them. The carbon nanotubes 5 are grown in the direction parallel to the substrate surface from a catalyst film 40 formed on a catalyst support film 4 (containing a catalyst support layer 4*a* and a foundation layer 4*b*). In this transistor, the carbon nanotubes 5 are responsible for a role as a channel region. That is, when a voltage is applied to the gate electrode composed of the insulating film 19 and the gate metal film 20, the conductive property of the carbon nanotubes 5 is changed. Thus, a current flowing between the source electrode 30 and the drain electrode 31 is changed.

Figure 4A:
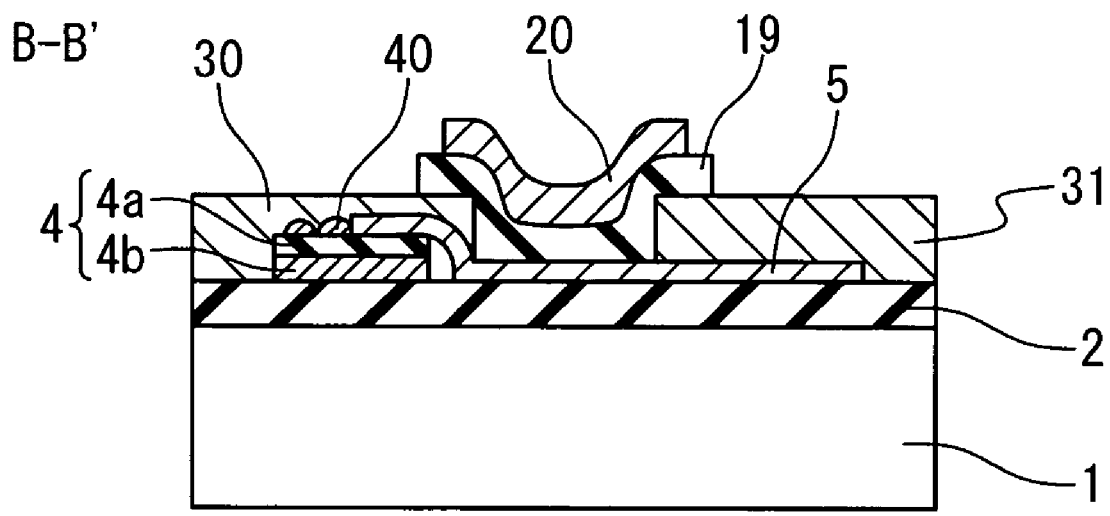
FIG. 4A and FIG. 4B are views showing another example of the structure of the transistor using the carbon nanotubes in the second embodiment of the present invention.
Figure 4B:
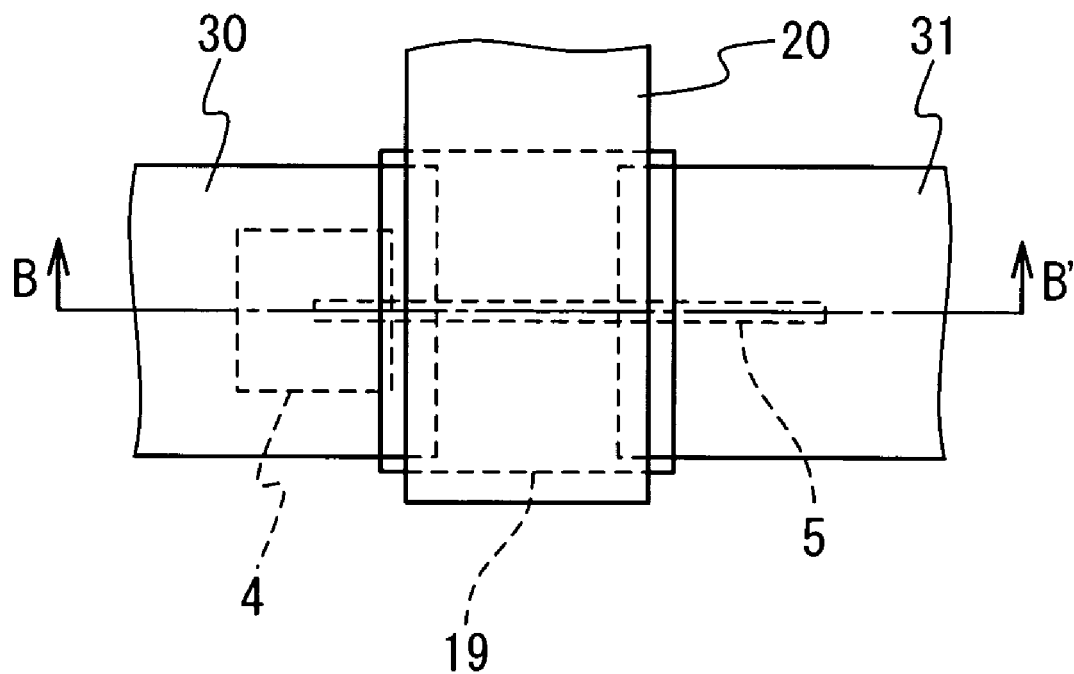

FIG. 4A and FIG. 4B are views showing another example of the structure of the transistor using the carbon nanotubes in the second embodiment of the present invention. FIG. 4B shows a top view of the transistor. FIG. 4A shows a sectional view along the line BB' of FIG. 4B. This transistor has the structure schematically similar to the transistor shown in FIG. 3A and FIG. 3B. However, it is different in point that the insulating film 19 and the gate metal film 20 are formed so as to sit astride the source electrode 30 and the drain electrode 131.

Figure 5A:
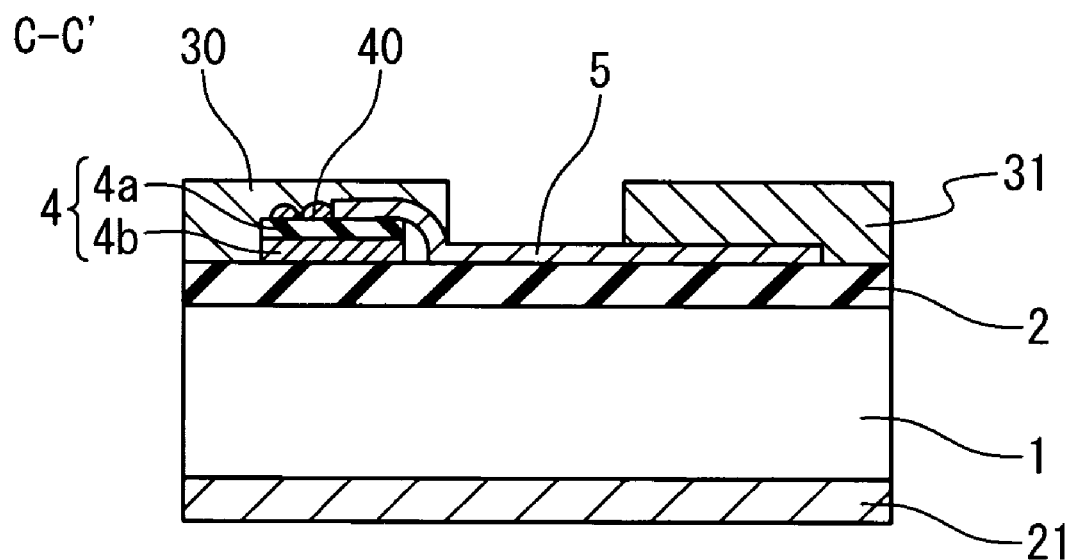
FIG. 5A and FIG. 5B are views showing still another example of the structure of the transistor using the carbon nanotubes in the second embodiment of the present invention.
Figure 5B:
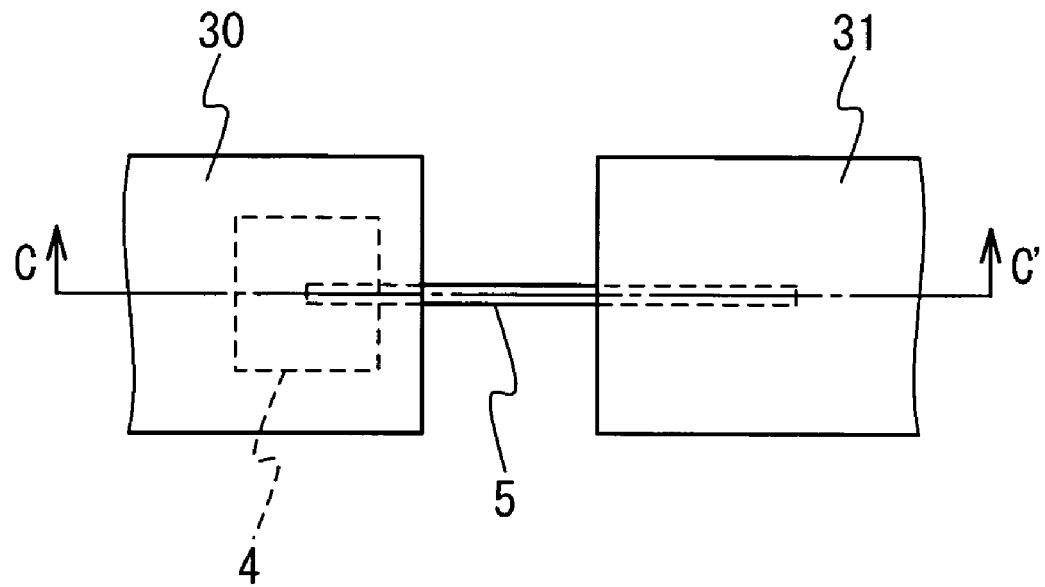

FIG. 5A and FIG. 5B are views showing still another example of the structure of the transistor using the carbon nanotubes in the second embodiment of the present invention. FIG. 5B is a top view of the transistor. FIG. 5A shows a sectional view along the line CC' of FIG. 5B. This transistor is the transistor of a so-called back gate type. Differently from the transistors of FIG. 3A and FIG. 3B and FIG. 4A and FIG. 4B, a gate electrode 21 is formed on the rear of the silicon substrate 1. In this transistor, the gate electrode 21 is formed at the position away from the carbon nanotubes 5. Thus, the formation of the gate electrode is easy.

In the present invention, the source electrode and the drain electrode may be variously arranged.

Figure 6:
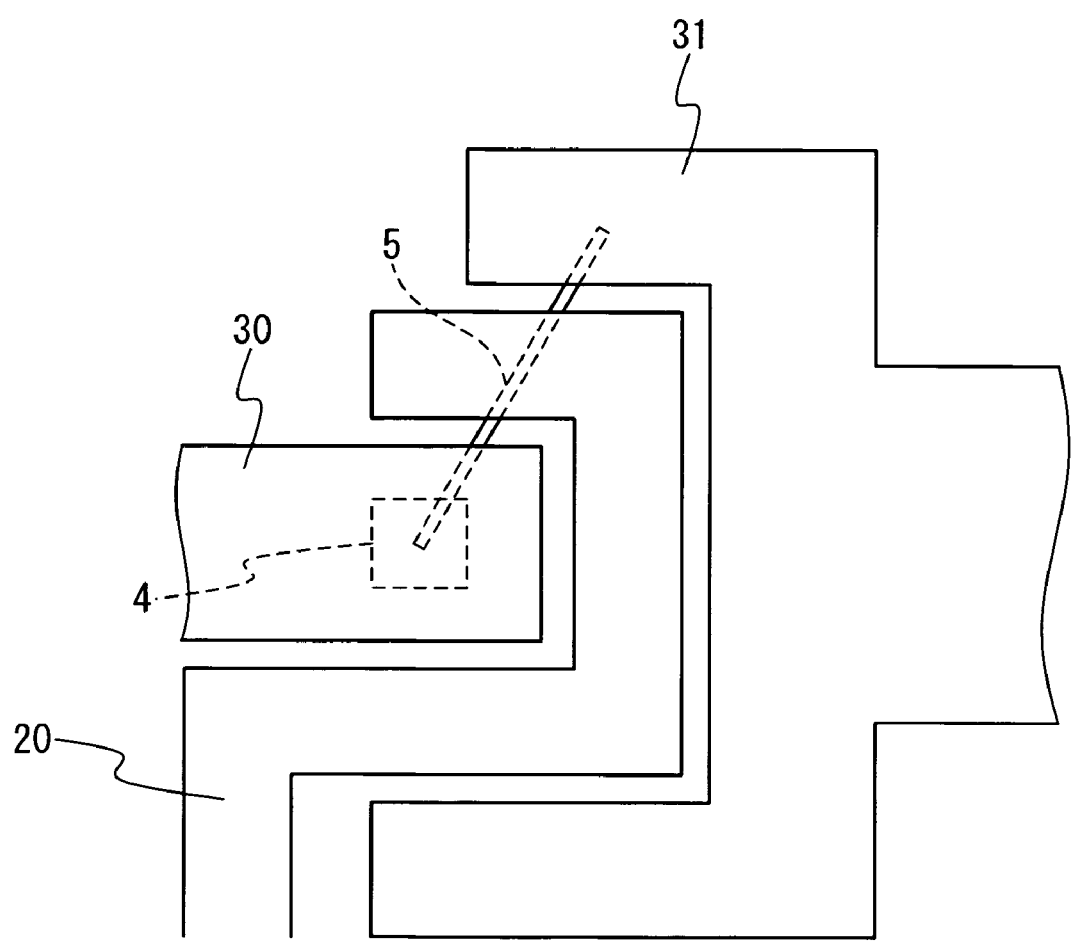
FIG. 6 is a top view showing another example of the structure of the transistor using the carbon nanotubes in the second embodiment of the present invention.

FIG. 6 is a top view showing another example of the structure of the transistor using the carbon nanotubes in the second embodiment of the present invention. In this transistor, the arrangements of the source electrode 30 and the drain electrode 31 are different from the transistors in FIG. 3A and FIG. 3B to FIG. 5A and FIG. 5B. The drain electrode 31 is formed so as to be separated from the source electrode 30 and surround a part of the periphery of the source electrode 30. The gate metal film 20 is formed in the region between the source electrode 30 and the drain electrode 31. The carbon nanotubes 5 are formed so as to sit astride the source electrode 30 and the drain electrode 31. These carbon nanotubes 5 are grown in vapor phase in the direction parallel to the surface of the substrate with the catalyst support film 4 as a start point. Since the source electrode 30 and the drain electrode 31 are arranged as mentioned above, the connection through the carbon nanotubes 5 between both of the electrodes can be surely attained. That is, when the carbon nanotubes 5 are grown in the vapor phase with the catalyst support film 4 as the start point, the direction of the growth can be all directions within the surface plane. In the case of employing the arrangement of FIG. 6, even if the growth direction of the carbon nanotubes 5 are fluctuated in various directions, the source electrode 30 and the drain electrode 31 can be surely connected through the carbon nanotubes 5.

Figure 7:
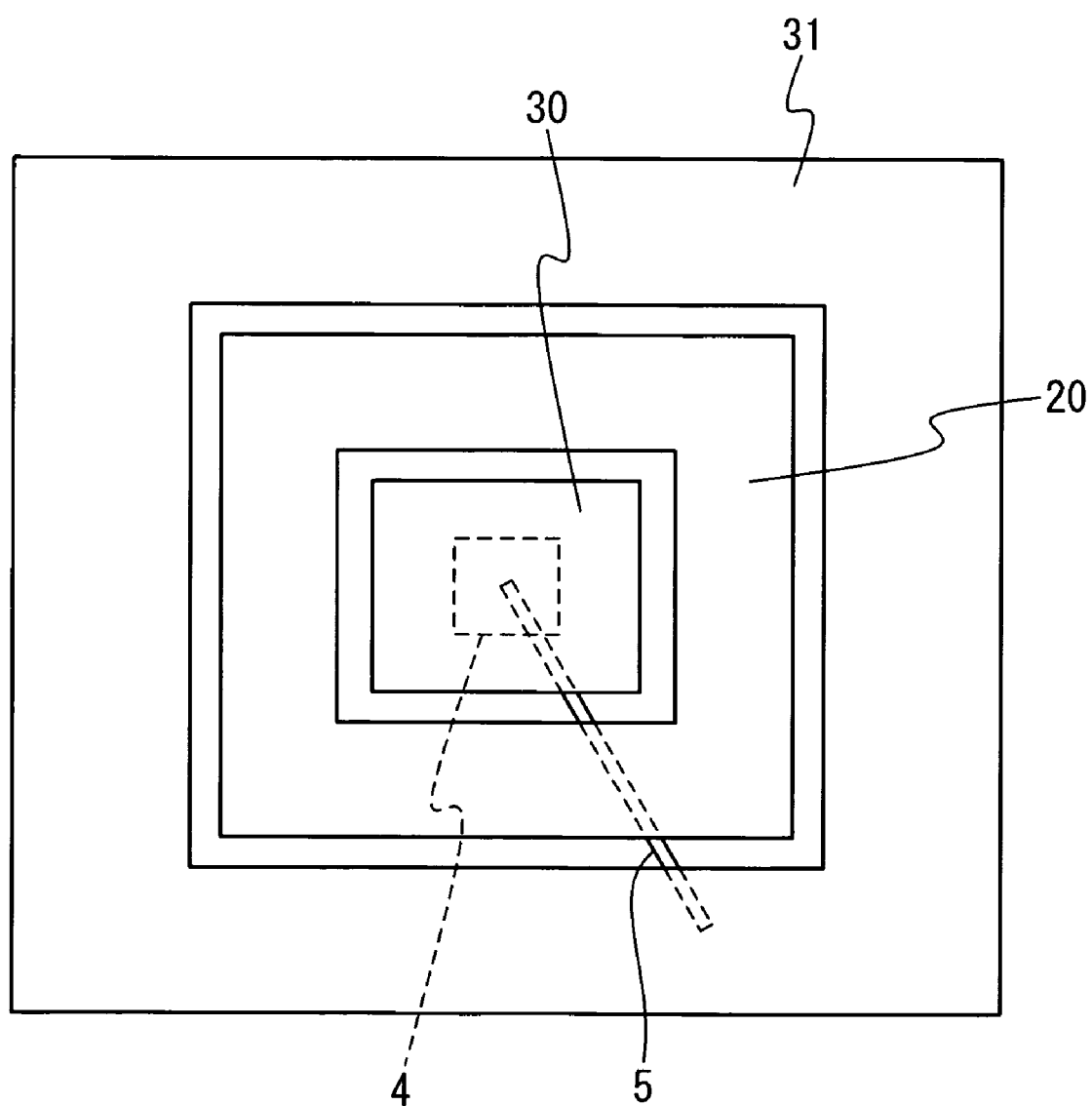
FIG. 7 is a top view showing still another example of the structure of the transistor using the carbon nanotubes in the second embodiment of the present invention.

FIG. 7 is a top view showing still another example of the structure of the transistor using the carbon nanotubes in the second embodiment of the present invention. In this transistor, the arrangements of the source electrode 30 and the drain electrode 31 are different from the transistors in FIG. 3A and FIG. 3B to FIG. 6. In this arrangement, around the source electrode 30, the drain electrode 31 is formed so as to be separated from the source electrode 30 and surround the periphery of the source electrode 30. The gate metal film 20 is formed between the source electrode 30 and the drain electrode 31. The carbon nanotubes 5 are formed so as to be connected to both of the source electrode 30 and the drain electrode 31. This carbon nanotubes 5 are grown in the direction parallel to the surface of the substrate with the catalyst support film 4 as the start point. In the case of employing this arrangement, even if the carbon nanotubes 5 are grown in any direction, the electric connection between the sources electrode 30 and the drain electrode 31 can be attained. Here, since the distance between the source electrode 30 and the drain electrode 31 is suitably set by considering the growth condition of the carbon nanotubes 5, the electric connection through a carbon nanotubes 105 can be made further sure.

In the transistor as mentioned above, the source electrode 30 and the drain electrode 31 can be the single-wall film made of gold, platinum, titanium and the like or the lamination film of them. As a gate metal film 120, at least one kind of metals, such as aluminum, gold, titanium and tungsten and the like, can be used.

One example of a method for manufacturing the transistor shown in FIG. 3A and FIG. 3B will be described below.

FIG. 8A to FIG. 8D, FIG. 9A to FIG. 9D and FIG. 10A to FIG. 10D are sectional views showing the method for manufacturing the transistor shown in FIG. 3A and FIG. 3B.

Figure 8A:
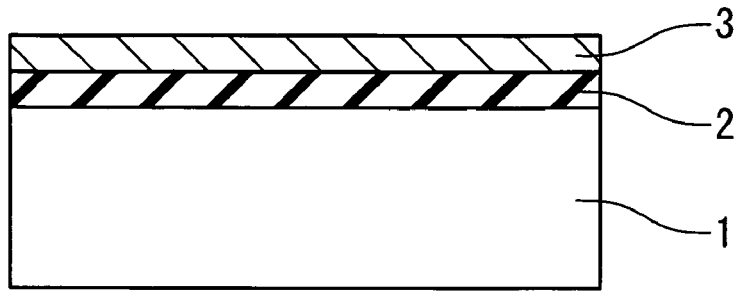

At first, the silicon oxide film 2 and a catalyst support material (the first metal film) 3 are formed on the silicon substrate 1, as shown in FIG. 8A. The catalyst support material 3 has the structure in which TiN, aluminum and aluminum oxide are laminated in this order. The TiN is used as the adhesive film to improve the adhesive property between the silicon oxide film 2 and the aluminum thereon.

Figure 8B:
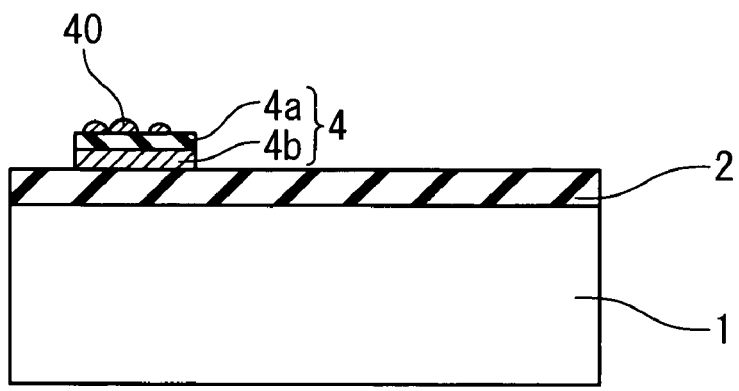

In succession, after mask is formed on the catalyst support material 3, the dry etching is carried out to pattern the catalyst support material 3 and form the catalyst support film 4. In this case, the catalyst support layer 4a is aluminum oxide. The foundation layer 4b is TiN and aluminum. The catalyst film 40 having iron (Fe) is formed on this catalyst support film 4 by using the depositing method. The film thickness of the catalyst film 40 is about 2 to 5 nm. The design of such film thickness enables the configuration that the catalyst film 40 is interspersed on a part of the surface of the catalyst support film 4. That is, the structure, in which both of the catalyst support film 4 and the catalyst film 40 are exposed, can be attained. Incidentally, here, the iron (Fe) is used as the material of the catalyst film 40. However, as mentioned above, the material other than this can be used. This situation is shown in FIG. 8B.

Figure 8C:
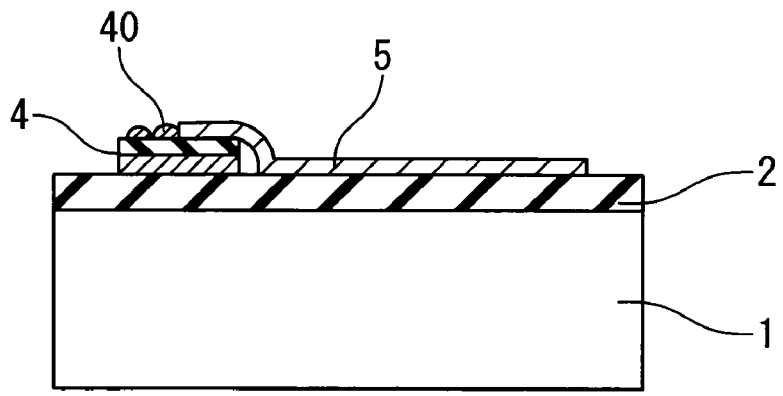

Next, the silicon substrate 1 is placed in a CVD film forming chamber. After that, the raw material gas, such as methane, acetylene and the like, is supplied to the silicon substrate 1. Thus, the carbon nanotubes 5 is grown in vapor phase from the catalyst film 40. The carbon nanotubes 5 are extended in the direction approximately parallel to the surface of the substrate. This situation is shown in FIG. 8C. In order to extend the carbon nanotubes 5 having the single-wall structure in the direction approximately parallel to the surface of the substrate, it is important to properly select the materials of the catalyst film 40 and support thereof and growth temperatures.

Figure 8D:
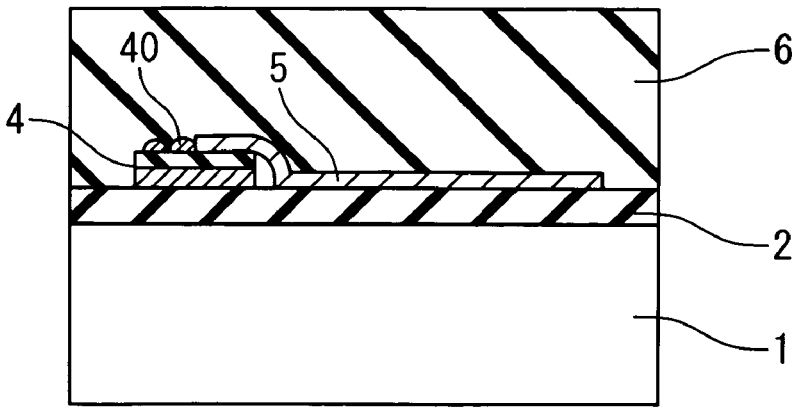

In succession, a resist 6 is formed so as to cover the catalyst support film 4 and the catalyst film 40. This situation is shown in FIG. 8D.

Next, as shown in FIG. 9A, the resist 6 is exposed through a mask 8 in which an opening is placed. Thus, a dissolvable region 10 dissolved in development solution is formed.

In succession, by processing the resist 6 surface with the predetermined solution such as monochloro-benzene, a resist deterioration layer 12 which is difficult to dissolve in the development solution is formed. This situation is shown in FIG. 9B.

After that, the dip in the development solution causes the exposure portion (including the dissolvable region 10) to be dissolved. At this time, the opening of the resist 6 has the reversely tapered shape. This situation is shown in FIG. 9C.

With this resist 6 as the mask, an electrode film 16 is deposited so as to cover the entire surface of the upper portion of the silicon substrate 1. This situation is shown in FIG. 9D.

Figure 10A:
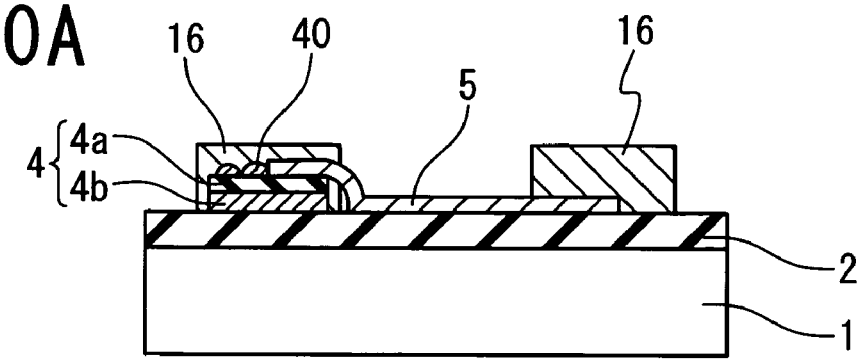

After that, the solvent is used to dissolve the resist 6. Thus, the resist 6 and the electrode film 16 on the resist 6 are removed (the lift-off method). This situation is shown in FIG. 10A. In the above-mentioned steps, as shown in FIG. 9C, since the opening of the resist 6 has the reversely tapered shape, the lift-off can be easily executed.

Figure 10B:
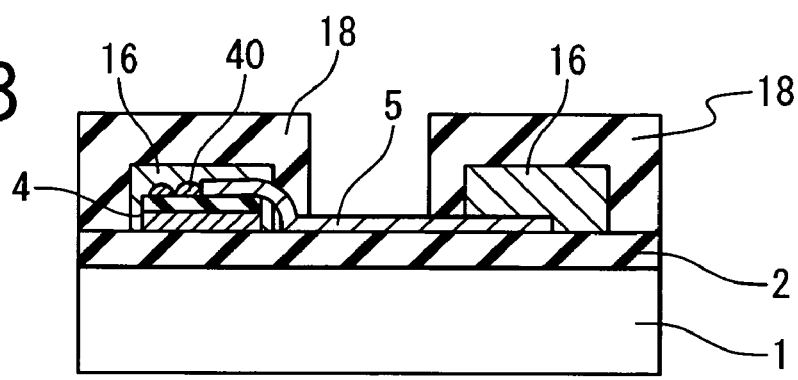

In succession, a resist 18 having an opening between the electrode films 16 is formed. This situation is shown in FIG. 10B.

Figure 10C:
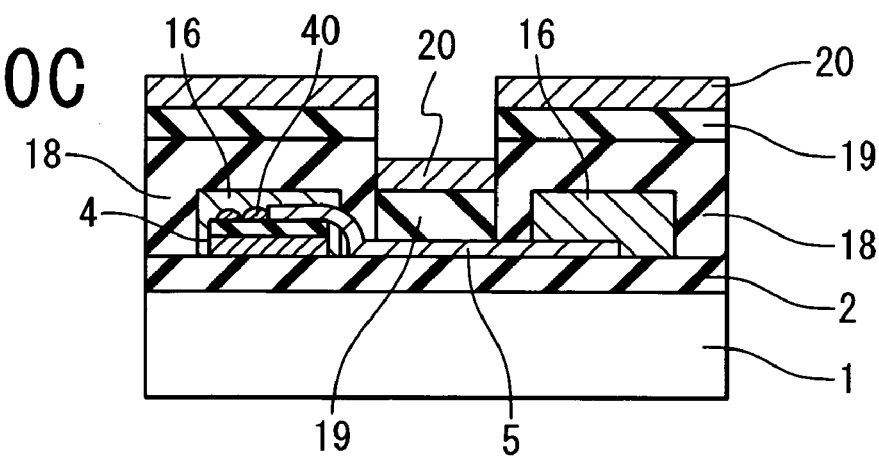

Next, with the resist 18 as the mask, the insulating film 19 and the gate metal film 20 are formed in this order. This situation is shown in FIG. 10C.

After that, this solvent is used to carry out a stripping process for the resist 18. Thus, the resist 18, and the insulating film 19 and the gate metal film 20 formed thereon are removed. This situation is shown in FIG. 10D.

Figure 10D:
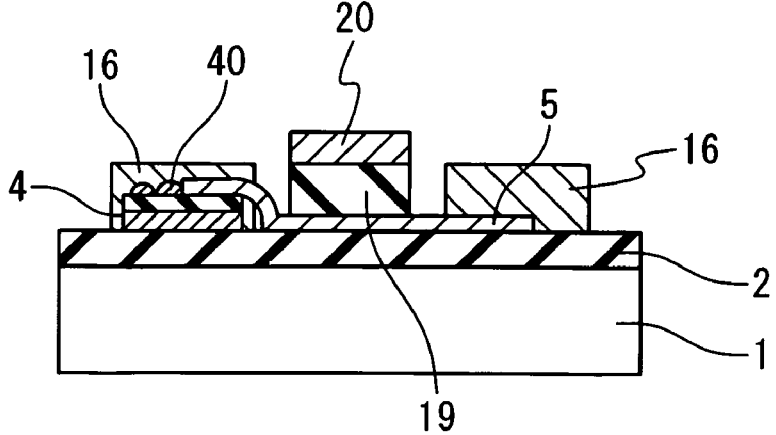

Due to the above-mentioned steps, the transistor of the structure shown in FIG. 10D is obtained. This transistor is driven such that any one of the electrode films 16 serves as the source electrode (corresponding to the source electrode 30 of FIG. 3A), and the other serves as the drain electrode (corresponding to the source electrode 31 of FIG. 3B). In this embodiment, by growing the carbon nanotubes 5 in the horizontal direction from the catalyst film 40, the electrode films 16 are connected with each other. Thus, as compared with the method for arranging the carbon nanotubes dispersed in the solvent between the electrodes, both of the electrodes can be connected at the higher precision. In addition, the contact resistance between the carbon nanotubes 5 and the electrode film 16 can be dropped.

As mentioned above, the embodiment of the present invention has been explained. Naturally, the respective members constituting the device and the respective steps constituting the processes can be suitably changed. For example, in FIG. 9C, the resist opening of the reversely tapered shape is placed. However, such a process may not be employed. At the step shown in FIG. 10B, the resist opening of the reversely tapered shape as mentioned above may be placed. The above-mentioned embodiment has been explained as the process for manufacturing the transistor of the structure shown in FIG. 3A and FIG. 10D. However, this method can be applied to manufacture the transistor of the structure shown in FIG. 4A and FIG. 5A.

FIRST EXAMPLE

This example shows an example in which the boehmite is used for the material of the catalyst support film, the iron is used for the material of the catalyst film, and the single-wall carbon nanotubes are grown on the substrate. At first, aluminum of 20 nm is deposited on the silicon substrate. After that, this is heated in water boiled at 100° C. for about 30 minutes. As a result, the aluminum is changed into aluminum hydroxide oxide (another name of boehmite). Moreover, it is heated at 600° C. in air for one hour, and converted into the γ alumina, and this is used as the catalyst support film. After that, the iron of 2 nm is deposited on the γ alumina and used as the catalyst.

This sample is inserted into an electric furnace having a diameter of about 2 inches and heated up to 800° C. in argon atmosphere. At the stage of the arrival at 800° C., the atmosphere gas is switched from the argon to methane (99.999%) and kept for five minutes. After that, it is again switched to the argon gas, and the temperature is dropped until it becomes a room temperature.

Figure 11:
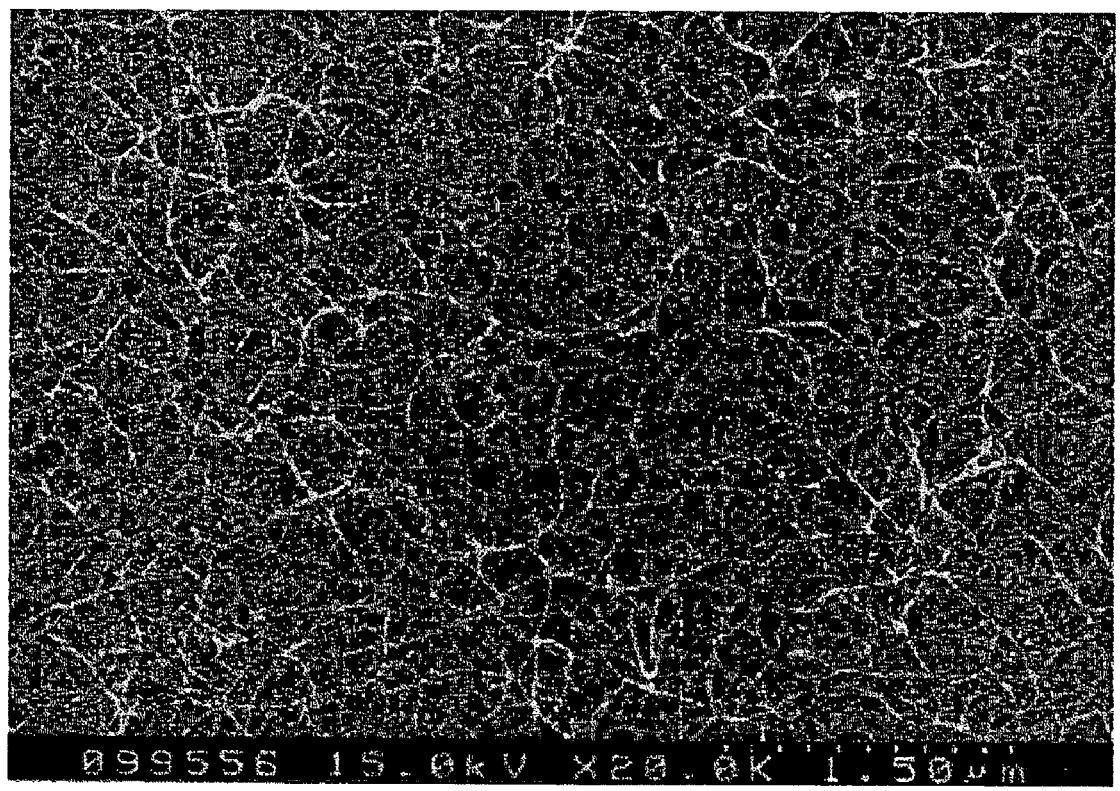
FIG. 11 is a photograph of the scanning electron microscope, showing the generated sediment in the example.

FIG. 11 is a photograph of the scanning electron microscope, showing the generated sediment.

Figure 12:
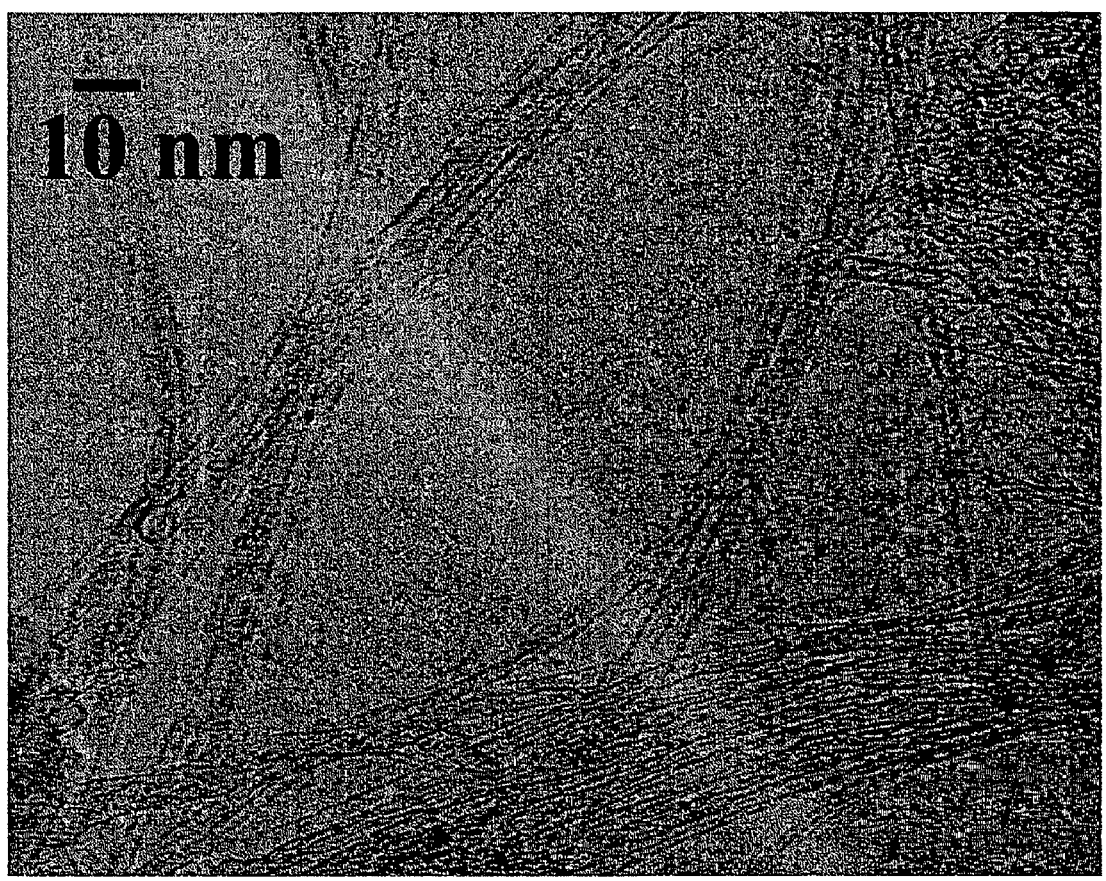
FIG. 12 is a photograph of the transmission electron microscope, showing the sediment shown in FIG. 11.

FIG. 12 is a photograph of a transmission electron microscope, showing the sediment shown in FIG. 11. From the observation result of FIG. 12, it is confirmed that this sediment is the single-wall carbon nanotubes.

FIG. 13A and FIG. 13B are Raman spectra of the sediment in FIG. 11. The vertical axis indicates the intensity of Raman scattering spectrum, and the horizontal axis indicates the wave number, respectively. An excitation light is a light of a wavelength 488 nm of Ar laser, and a spot size of the laser is about 1 micron. In this Raman spectrum, a large peak (a so-called tangential mode) could be observed near 1590 $cm^{-1}$, and a peak (a so-called breathing mode) could be observed in a range of 100 to 300 $cm^{-1}$. The tangential mode and the breathing mode are the spectra having the feature in the single-wall carbon nanotubes. That is, even from this, it could be confirmed that the single-wall carbon nanotubes were generated.

It is known that there is the unique relation between the position of the peak of the breathing mode and the diameter of the single-wall carbon nanotubes. In the case of this example, the peak distributed in the approximate range between 100 $cm^{-1}$ and 250 $cm^{-1}$. Thus, it was understood that the diameter of the single-wall carbon nanotubes was approximately between about 0.9 nm and about 2 nm.

Also, although the similar sediment could be confirmed even at 700° C., the yield was reduced as compared with that of 800° C. However, it was possible to increase the yield by reducing for about five minutes in hydrogen atmosphere before supplying the methane. By carrying out the reducing process, the similar sediment could be confirmed in a range between 600° C. and 900° C.

SECOND EXAMPLE

In the first example, the catalyst was formed on the catalyst support made of the boehmite. In this example, the iron film was formed on the silicon oxide film, and the carbon nanotubes were then grown. Also in this example, although the single-wall carbon nanotubes were obtained, the yield was low as compared with the first example.

THIRD EXAMPLE

In the first example, the metal film thickness of the iron (catalyst) was changed from 1 nm to 5 nm. As a result, in any film thickness, similarly to the first example, the single-wall carbon nanotubes were confirmed from the Raman spectra and the observation of the scanning electron microscope. Since the surfaces of the boehmite and transition alumina have the structure of the shape of the flower leaf between approximately several hundred nm and several μm, it is considered that the growth of the single-wall carbon nanotubes is possible even at the film thickness of the iron of about several μm.

Figure 14:
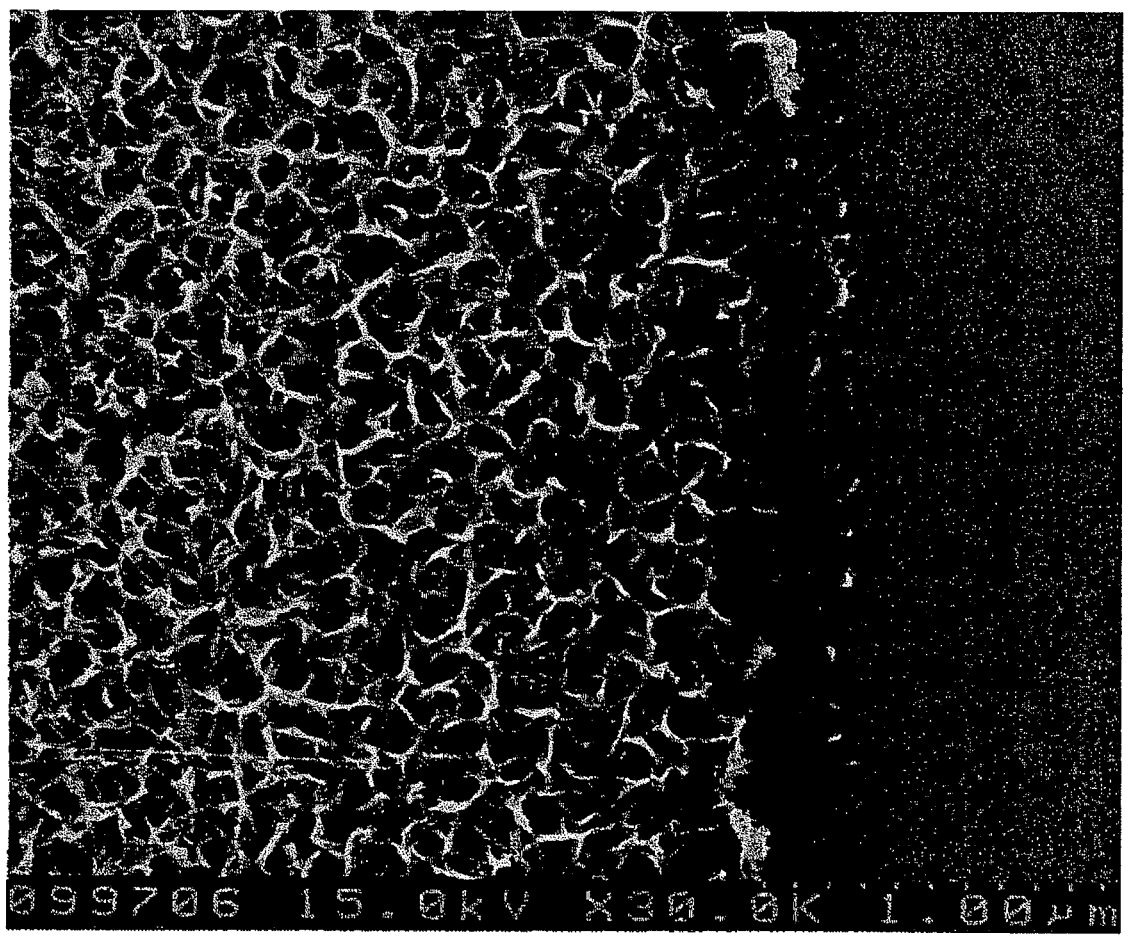
FIG. 14 and FIG. 15 are photographs of the scanning electron microscope, showing the boehmite formed similarly to the first example.
Figure 15:
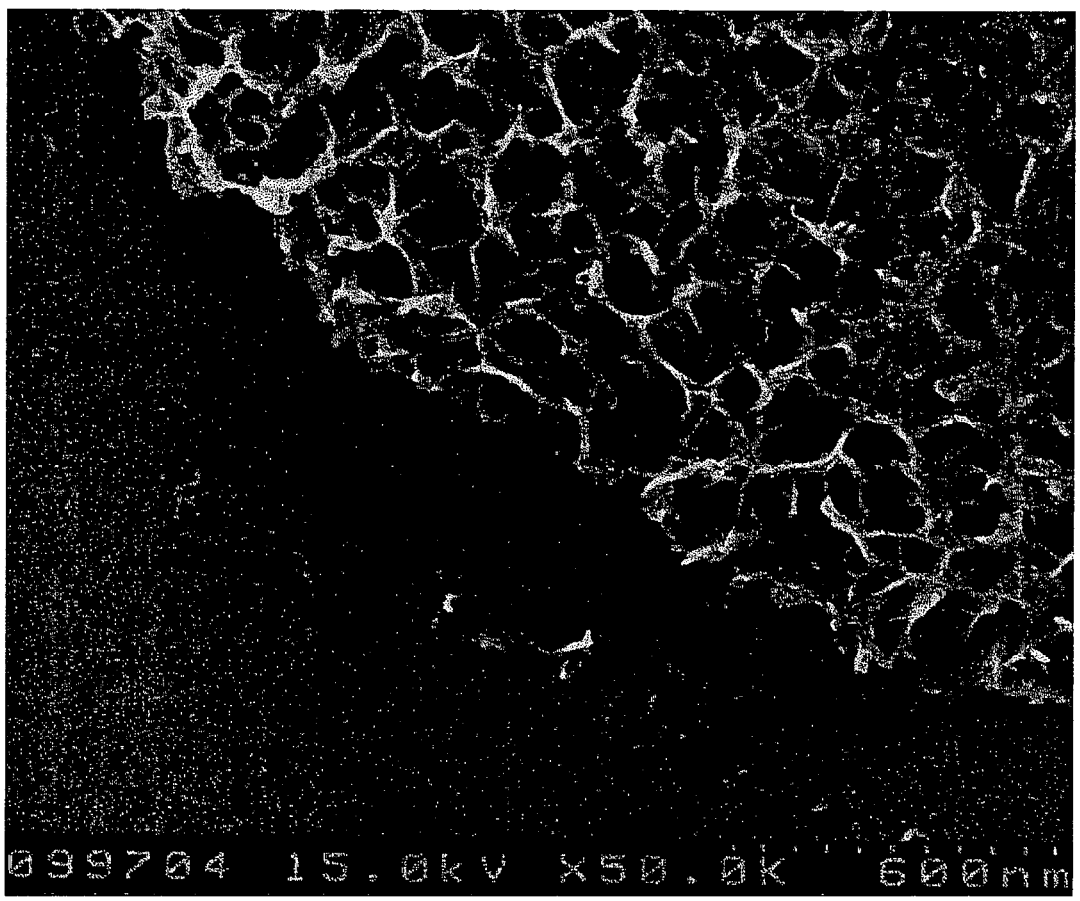

FIG. 14 and FIG. 15 are photographs of the scanning electron microscope, showing the boehmite formed similarly to the first example. It was confirmed that this boehmite had the structure of the shape of the flower leaf as mentioned above.

FOURTH EXAMPLE

In this example, after the aluminum was deposited on the silicon substrate, the component left in the air for about one or two days was used as the support of the catalyst. The iron of 2 nm as the catalyst was deposited on this catalyst support (aluminum natural oxide film). After that, similarly to the first example, under the atmosphere of 800° C., the methane gas is supplied to generate the single-wall carbon nanotubes.

Figure 16:
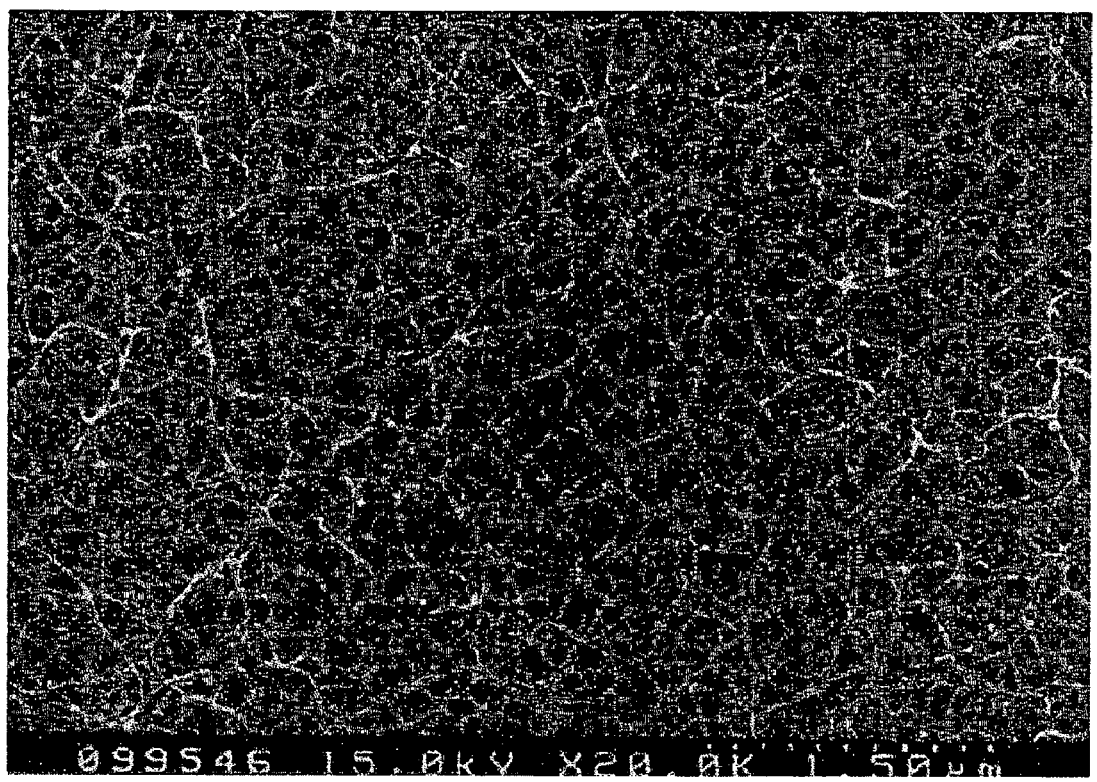
FIG. 16 is a photograph of the scanning electron microscope, showing the obtained carbon nanotubes in the example.

FIG. 16 is a photograph of the scanning electron microscope, showing the obtained carbon nanotubes. As compared with that of FIG. 11, there is light and shade. This is because the amount of the sediment is varied, depending on the place.

Figure 17A:
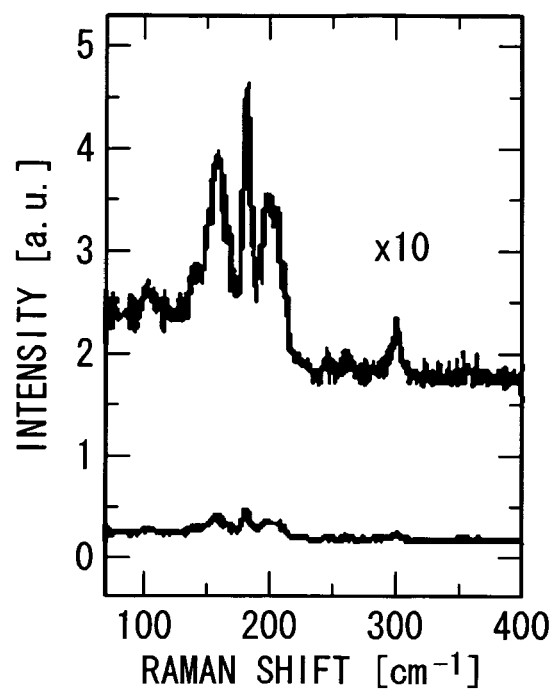
FIG. 17A and FIG. 17B are Raman spectra of the carbon nanotubes shown in FIG. 16.
Figure 17B:
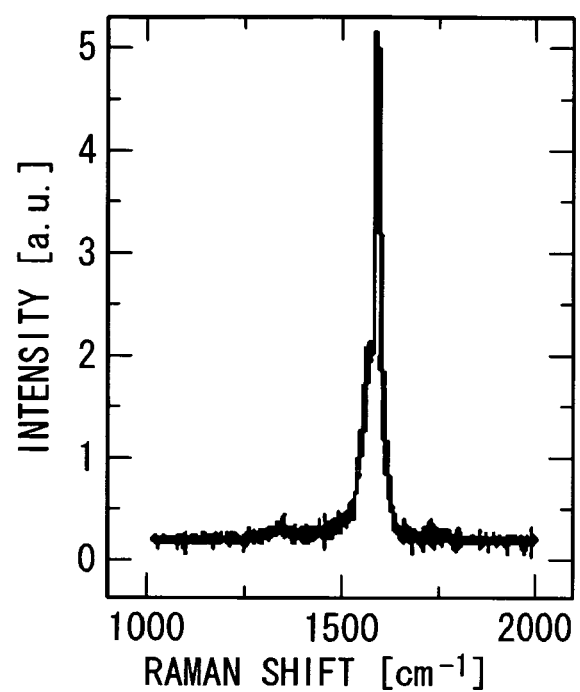

FIG. 17A and FIG. 17B are Raman spectra of the carbon nanotubes shown in FIG. 16. The vertical axis indicates the intensity of the Raman scattering spectrum, and the horizontal axis indicates the wave number, respectively. The characteristic tangential mode and breathing mode in the single-wall carbon nanotubes were observed.

FIFTH EXAMPLE

This example is an example of patterning the catalyst support film. At first, the silicon oxide film of about 15 nm was thermally oxidized and formed on the silicon substrate. Next, the patterning was performed on the resist for the optical exposure of a thickness of about 1.8 μm, and aluminum of 20 nm was deposited thereon. Then, this was heated with water of 100° C. for 30 minutes, and the aluminum was converted into the boehmite. After the iron of 2 nm serving as the catalyst was deposited thereon, the boehmite and the iron on the resist were lifted off and removed in acetone. In this way, the support/catalyst structure composed of the patterned boehmite/iron was formed.

After that, similarly to the first example, under the atmosphere of 800° C., the methane gas is supplied to generate the single-wall carbon nanotubes.

Figure 18:
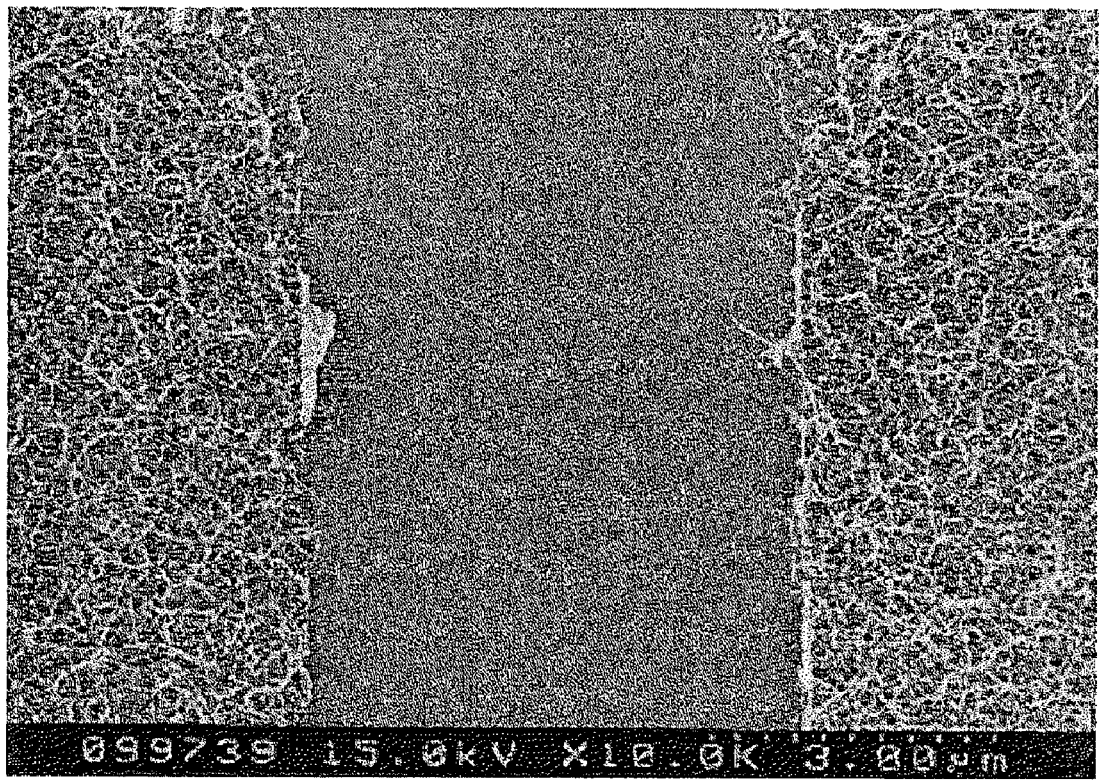
FIG. 18 is a photograph of the scanning electron microscope, showing the obtained carbon nanotubes in the example.

FIG. 18 is a photograph of the scanning electron microscope, showing the obtained carbon nanotubes. As can be understood from FIG. 18, the catalyst and the support did not exist in the center, and the sediment grown from this portion was not confirmed. On the other hand, much sediment was confirmed in the region where the catalyst and the support were formed on both sides.

FIG. 19A and FIG. 19B are the Raman spectra of the carbon nanotubes shown in FIG. 18. The vertical axis indicates the intensity of the Raman scattering spectrum, and the horizontal axis indicates the wave number, respectively. The characteristic tangential mode and breathing mode in the single-wall carbon nanotubes were observed.

In this example, the application of a direct current electric field of about 0.5 MV/m or more or an alternating current electric field of 0.1 MV/m or more enables the growth direction of the carbon nanotubes to be uniformed in the electric field direction.

Figure 20:
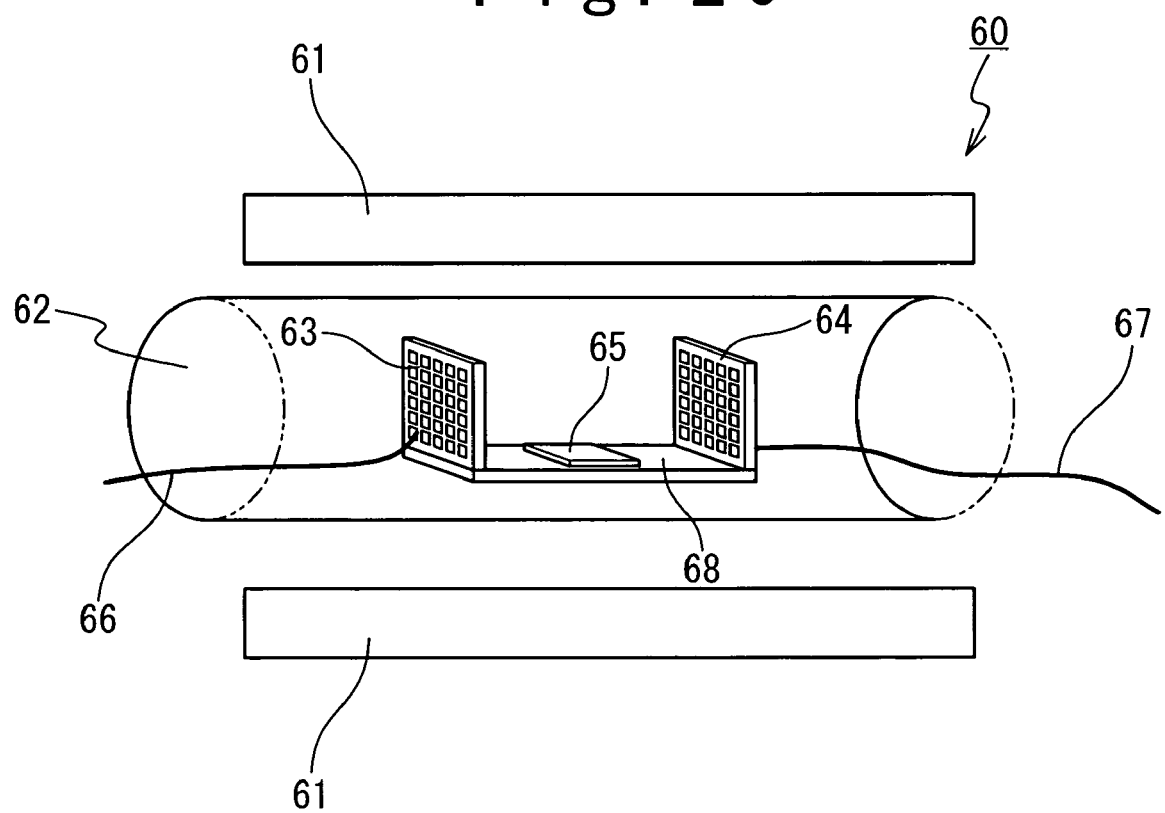
FIG. 20 is a view showing a example of the configuration of an apparatus in which the growth direction of the carbon nanotubes is uniformed in the electric field direction.

FIG. 20 is a view showing a example of the configuration of an apparatus in which the growth direction of the carbon nanotubes is uniformed in the electric field direction. This apparatus 60 has an electrode 63, an opposite electrode 64 and a substrate supporting member 68 placed between them, within a reaction tube 62. Electric power is supplied through feeder lines 66, 67 to the electrode 63 and the opposite electrode 64, respectively. A heater 61 for heating is placed around the reaction tube 62 so as to be able to adjust the atmosphere temperature of the reaction tube 62. The electrode 63, the opposite electrode 64 and the substrate supporting member 68 are desired to be made of the materials that can endure the temperature at the time of the growth. The substrate supporting member 68 is desired to be made of an insulator such as quartz. The electrode 63 and the opposite electrode 64 use the materials in which the metals, that can endure the temperature at the time of the growth such as platinum and the like, are film-formed on the mesh structure of the quartz.

When this apparatus 60 is used to grow the carbon nanotubes, the electric field is generated between both of the electrodes, in the situation that a substrate 65 where the catalyst support film and the catalyst film are formed is placed between the electrode 63 and the opposite electrode 64. Since meshed holes are made in the electrode 63 and the opposite electrode 64, the carbon material can be efficiently supplied through the holes to the catalyst on the substrate 65.

SIXTH EXAMPLE

In this example, the single-wall carbon nanotubes were used to manufacture the transistor and carry out the evaluation. Similarly to the fourth example, after the deposition of the aluminum of 20 nm, it was left in the air for two days, and the iron of 2 nm was then deposited as the catalyst, and the single-wall carbon nanotubes were grown. The growth temperature was set 800° C. After that, the processes shown in FIG. 8D, FIG. 9A to FIG. 9D and FIG. 10A to FIG. 10D in the second embodiment were carried out to manufacture the transistor. In FIG. 8D, FIG. 9A to FIG. 9D and FIG. 10A to FIG. 10D, the insulating film 19 was the titanium oxide film (the film thickness of 2 nm) formed by naturally oxidizing the titanium film, and the gate metal film 20 was the platinum film (the film thickness of 10 nm), and the source electrode 30 and the drain electrode 31 were the metal films (the film thickness of 10 nm). Although this transistor has the structure schematically shown in FIG. 3A and FIG. 3B, the source electrode 30 and the drain electrode 31 are not arranged as shown in FIG. 3B, but arranged as shown in FIG. 6.

Figure 21:
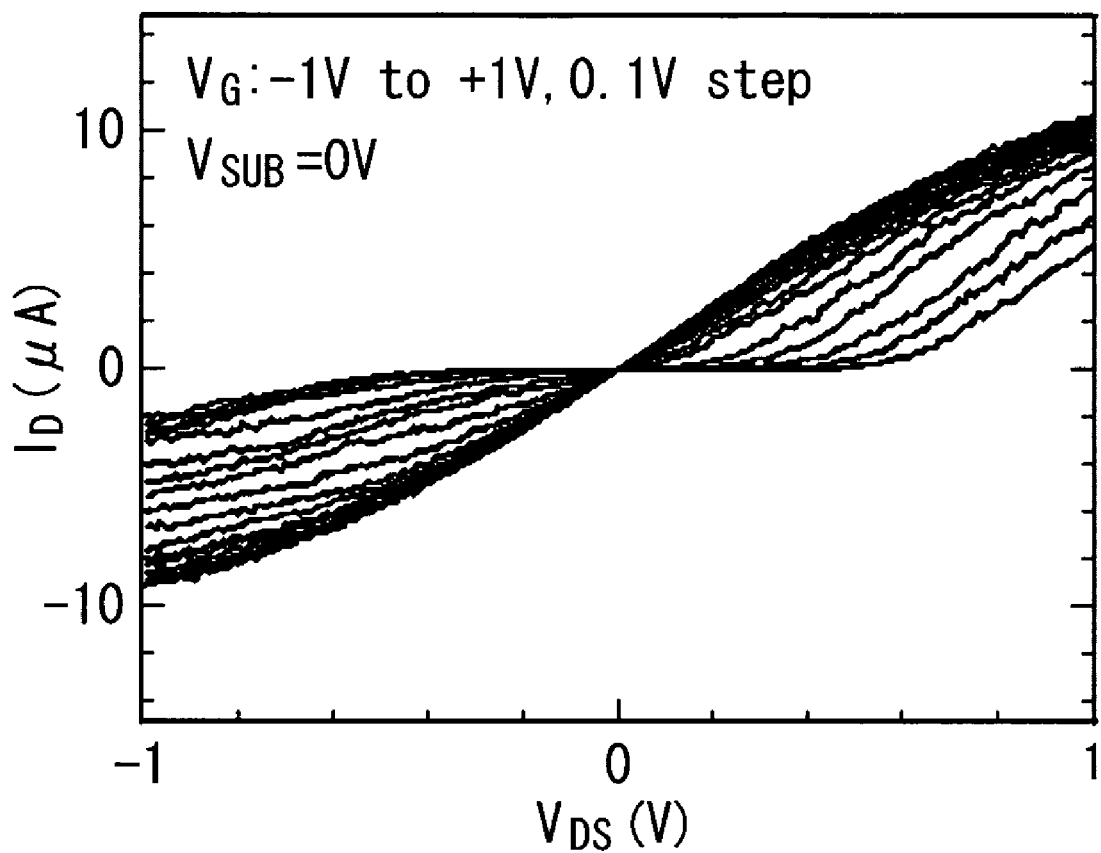
FIG. 21 is a graph showing the evaluation result of the obtained transistor.

FIG. 21 is a graph showing the evaluation result of the obtained transistor. The horizontal axis indicates the voltage between the source and the drain, and the vertical axis indicates the drain current, respectively. The substrate was grounded; the voltage applied to the gate voltage was changed at a rate of 0.1 V from −1 V to 1 V, and the I-V property was evaluated. It was confirmed that the transistor obtained in this example indicated the excellent property.

As explained above, the catalyst support substrate according to the present invention has the main surface where the first region including the carbon nanotube vapor phase growth catalyst and the second region including the material containing the particular element are exposed. Thus, due to the synergistic effect of those regions, the carbon nanotubes which are excellent in the adhesive property to the substrate and the patterning property can be obtained at the high yield. Also, the single-wall carbon nanotubes which are excellent in the electric property can be stably obtained.

Also, in the method for growing the carbon nanotubes according to the present invention, the carbon nanotubes of the high quality, especially, the single-wall carbon nanotubes can be stably obtained at the high yield. The obtained carbon nanotubse are excellent in the adhesive property to the substrate, and can be preferably applied to the electronic device, such as the transistor which is excellent in the high speed operation property and high integration property, and the like.

Also, the transistor according to the present invention has the structure that the carbon nanotubes extended in the direction horizontal to the substrate from the catalyst containing film is connected to the electrodes. Thus, the adhesive property between the carbon nanotubes and the electrodes is excellent. Also, when the carbon nanotubes are the single-wall carbon nanotubes, the device property excellent in the high speed operation property can be stably obtained. In addition, since the voltage application causes the channel current flowing through the carbon nanotubes to be largely varied, the ideal transistor can be obtained.

Moreover, the method for manufacturing the transistor according to the present invention uses the method for growing the carbon nanotubes as mentioned above and forms the carbon nanotube portion. Thus, the transistor, which is excellent in the high speed operation property and the reliability, can be obtained under the excellent manufacture stability.

In the present invention, when the configuration in which the catalyst film covering the part of the catalyst support film is formed on the catalyst support film is employed, the adhesive property to the substrate becomes excellent, and the film quality of the catalyst support becomes excellent. As a result, the carbon nanotubes, which are excellent in the adhesive property to the substrate and excellent in the electric property, can be formed on the substrate at the high yield. In addition, the patterning property of the catalyst support film, the film thickness control property and the manufacturing stability can be made excellent.

The invention claimed is:

1. A catalyst supporting substrate comprising:
a first region which is formed on a substrate,
said first region including a catalyst supporting portion containing a first material;
said first material including a metal containing at least one of elements selected from the second group to the fourteenth group of the periodic table or a compound thereof, an upper portion of the first region being oxidized or hydroxylated to form the catalyst supporting portion, and
a second region which is formed covering a part of said first region;
said second region including a catalyst portion containing a second material which is different from said first material,
said second material is a catalyst which grows carbon nanotubes in a vapor phase.

2. The catalyst supporting substrate according to claim 1, wherein said carbon nanotubes include single-wall carbon nanotubes.

3. The catalyst supporting substrate according to claim 1, wherein said second material includes a metal containing at least one of elements selected from a group consisting of Fe, Ni, Co, Ru, Rh, Pd, Os, Ir, Pt, La, Y, Mo and Mn or a compound thereof.

4. The catalyst supporting substrate according to claim 3, wherein said first material includes a metal containing at least one of elements selected from a group consisting of Al, Mo, Ti, Ta, Cr, Cu, Mn, Mg, Zr, Hf, W, Ru, Rh, Zn and Sn or a compound thereof.

5. The catalyst supporting substrate according to claim 1, wherein said first region includes a metal film which contains said first material and is formed on said substrate, and said catalyst supporting portion includes a film that an upper portion of said metal film is oxidized or hydroxylated.

6. The catalyst supporting substrate according to claim 5, wherein said second material includes a metal containing at least one of elements selected from a group consisting of Fe, Ni, Co, Ru, Rh, Pd, Os, Ir, Pt, La, Y, Mo and Mn or a compound thereof.

7. The catalyst supporting substrate according to claim 6, wherein said first material includes a metal containing at least one of elements selected from a group consisting of Al, Mo, Ti, Ta, Cr, Cu, Mn, Mg, Zr, Hf, W, Ru, Rh, Zn and Sn or a compound thereof.

8. The catalyst supporting substrate according to claim 7, wherein a surface of said catalyst supporting portion includes at least one selected from aluminum natural oxide film, boehmite, $\alpha$ alumina, $\gamma$ alumina, $\delta$ alumina, and $\theta$ alumina.

9. A method for growing carbon nanotubes comprising:
(a) providing a catalyst supporting substrate, wherein said catalyst supporting substrate including:
a first region which is formed on a substrate, said first region including a catalyst supporting portion containing a first material;

said first material including a metal containing at least one of elements selected from the second group to the fourteenth group of the periodic table or a compound thereof, an upper portion of the first region being oxidized or hydroxylated to form the catalyst supporting portion, and a second region which is formed covering a part of said first region; said second region including a catalyst portion containing a second material which is different from said first material, said second material is a catalyst which grows carbon nanotubes in a vapor phase; and (b) growing said carbon nanotubes by supplying raw material gas containing carbon to the catalyst supporting substrate.

10. The method for growing carbon nanotubes according to claim 9, wherein said carbon nanotubes include single-wall carbon nanotubes.

11. The method for growing carbon nanotubes according to claim 9, wherein said step (b) includes:
(b1) growing said carbon nanotubes in the direction along a surface of said catalyst supporting substrate.

12. The method for growing carbon nanotubes according to claim 11, wherein said step (b1) includes:
(b11) applying an electric field with the predetermined direction to said catalyst supporting substrate.

13. The method for growing carbon nanotubes according to claim 9, wherein said step (b) includes:
(b2) bringing reducing gas into contact with a surface of said catalyst supporting substrate.

14. The method for growing carbon nanotubes according to claim 9, wherein said step (a) includes:
(a1) forming said first region and said second region which are patterned with predetermined shapes on said substrate.

15. The method for growing carbon nanotubes according to claim 14, wherein said carbon nanotubes include single-wall carbon nanotubes.

16. The method for growing carbon nanotubes according to claim 14, wherein said second material includes a metal containing at least one of elements selected from a group consisting of Fe, Ni, Co, Ru, Rh, Pd, Os, Ir, Pt, La, Y, Mo and Mn or a compound thereof.

17. The method for growing carbon nanotubes according to claim 16, wherein said first material includes a metal containing at least one of elements selected from a group consisting of Al, Mo, Ti, Ta, Cr, Cu, Mn, Mg, Zr, Hf, W, Ru, Rh, Zn and Sn or a compound thereof.

18. The method for growing carbon nanotubes according to claim 14, wherein said step (a1) includes:
(a11) forming a catalyst supporting portion which is patterned with predetermined shape on said substrate, and
(a12) forming a catalyst portion which covers a part of a surface of said catalyst supporting portion.

19. The method for growing carbon nanotubes according to claim 18, wherein said step (a11) includes:
(a111) forming a metal film which contains at least one of elements selected from the second group to the fourteenth group of the periodic table, and
(a112) forming said catalyst supporting portion by oxidizing or hydroxylating an upper portion of said metal film.

20. The method for growing carbon nanotubes according to claim 18, wherein said step (a12) includes:
(a121) forming said catalyst portion by any one of methods of a deposition method, a sputtering method and a CVD method.

21. The method for growing carbon nanotubes according to claim 14, wherein said step (b) includes:
(b3) growing said carbon nanotubes in the direction along a surface of said catalyst supporting substrate by applying an electric field with the predetermined direction to said catalyst supporting substrate.

22. The method for growing carbon nanotubes according to claim 14, wherein said step (b) includes:
(b4) bringing reducing gas into contact with a surface of said catalyst supporting substrate.

23. A method for manufacturing a transistor comprising:
(a) forming a catalyst containing film, which is patterned with a predetermined shape, on a semiconductor substrate, wherein said catalyst containing film includes:

a first region which is formed on a substrate, said first region including a catalyst supporting portion containing a first material;

said first material including a metal containing at least one of elements selected from the second group to the fourteenth group of the periodic table or a compound thereof, an upper portion of the first region being oxidized or hydroxylated to form the catalyst supporting portion, and a second region which is formed covering a part of said first region;

said second region including a catalyst portion containing a second material which is different from said first material, said second material is a catalyst which grows carbon nanotubes in a vapor phase, (b) growing said carbon nanotubes in the direction along a surface of said semiconductor substrate by supplying raw material gas containing carbon to said catalyst containing substrate;

(c) forming a first electrode which is connected to a part of said catalyst containing film side of said carbon nanotubes and a second electrode which is connected to a part of another side of said carbon nanotubes; and (d) forming a gate electrode which applies a voltage to said carbon nanotubes between said first electrode and said second electrode.

* * * * *